US012777658B2

(12) United States Patent
Shield et al.

(10) Patent No.: US 12,777,658 B2
(45) Date of Patent: Oct. 27, 2026

(54) CORE/SHELL NANOPARTICLE-BASED DEVICES FOR SENSORS AND NEUROMORPHIC COMPUTING

(71) Applicant: NUtech Ventures, Lincoln, NE (US)

(72) Inventors: Jeff Shield, Lincoln, NE (US); Zahra Ahmadi, Lincoln, NE (US)

(73) Assignee: Nutech Ventures, Lincoln, NE (US)

( * ) Notice: Subject to any disclaimer, the term of this patent is extended or adjusted under 35 U.S.C. 154(b) by 714 days.

(21) Appl. No.: 18/110,751

(22) Filed: Feb. 16, 2023

(65) Prior Publication Data

US 2023/0209839 A1 Jun. 29, 2023

Related U.S. Application Data

(63) Continuation of application No. PCT/US2021/046319, filed on Aug. 17, 2021.

(60) Provisional application No. 63/087,421, filed on Oct. 5, 2020, provisional application No. 63/067,002, filed on Aug. 18, 2020.

(51) Int. Cl.

*H10B 63/00* (2023.01)
*G11C 11/54* (2006.01)
*G11C 13/00* (2006.01)

(52) U.S. Cl.

CPC .............. *H10B 63/24* (2023.02); *G11C 11/54* (2013.01); *G11C 13/0002* (2013.01)

(58) Field of Classification Search

CPC ............. H10N 70/883; H10N 70/8833; H10N 70/8836; H10N 70/021; H01B 63/32; H01B 63/20

See application file for complete search history.

(56) References Cited

U.S. PATENT DOCUMENTS

| | | | |
|---|---|---|---|
| 9,409,148 B2 | 8/2016 | Lin et al. |
| 9,791,403 B2 | 10/2017 | Mickelson et al. |
| 10,290,804 B2 | 5/2019 | Ruiz et al. |
| 2018/0197077 A1 | 7/2018 | Brown et al. |

FOREIGN PATENT DOCUMENTS

KR 10-2016-0002027 A 1/2016

OTHER PUBLICATIONS

Hu et al., Bipolar resistive switching behavior in Au/Pt—Fe2O3 core-shell nanoparticles assembly/Ti with 3 3 crossbar array structure, Microelectronic Engineering, 127 (2014) 40-43 (Year: 2014).*

Written Opinion of the International Searching Authority in International Application No. PCT/US2021/046319, filed on Aug. 17, 2021.

(Continued)

*Primary Examiner* — Adam Krupicka

(74) *Attorney, Agent, or Firm* — Gerald T. Gray; Leydig, Voit & Mayer, LTD.

(57) ABSTRACT

Disclosed herein are core/shell nanoparticles each comprising a metallic core; a shell formed of a metal oxide and surrounding the metallic core; wherein the nanoparticle is characterized by bipolar resistive switching in response to an applied voltage or current. Also disclosed are devices comprising such nanoparticles, as well as methods of using and methods of making such devices.

21 Claims, 27 Drawing Sheets

(56) References Cited

OTHER PUBLICATIONS

Chen, G. et al., "Resistive Switching and Magnetic Modulation in Cobalt-Doped ZnO", *Advanced Materials*, vol. 24, Article 26, 99 3515-3520 (2012).
Wei, T. et al., "High permittivity polymer embedded with CoZnO core/shell nanoparticles modified by organophosphorus acid", *Applied Physics Letters*, vol. 91, Article 22, pp. 222907-1-222907-3, (2007).
Simanjuntak, F.M. et al., "Status and prospects of ZnO-based resistive switching memory devices", *Nanoscale research letters*, vol. 11, Article 1, pp. 1-31. (2016).
Xu et al., "Co Nanoparticles Induced Resistive Switching and Magnetism for the Electrochemically Deposited Polypyrrole Composite Films" (2014) https://pubs.acs.org/doi/10.1021/am5044399.
More et al., "Resistive switching and synaptic properties modifications in gallium-doped zinc oxide memristive devices" (2012) https://www.sciencedirect.com/science/article/pii/S2211379719302128.
Cruz-Albrecht et al., "A scalable neural chip with synaptic electronics using CMOS integrated memristor," IPO Publishing, Sep. 2, 2013.
Kumar et al., "Formation of nanodiamonds at near-ambient conditions via microplasma dissociation of ethanol vapour," Nature Communications, Oct. 21, 2013.
El-Toni et al., "Design, synthesis and applications of core-shell, hollow core, and nanorattle multifunctional nanostructures," Nanoscale, Jan. 14, 2016.
Mayoral et al., "A novel Co@Au structure formed in bimetallic core@shell nanoparticles," ChemComm, Feb. 18, 2015.
Sokolov et al., "Partially Oxidized MXene Ti3C2Tx Sheets for Memristor having Synapse and Threshold Resistive Switching Characteristics," Advanced Science News, 2020.
Nomoev et al., "Structure and mechanism of the formation of core-shell nanoparticles obtained through a one-step gas-phase synthesis by electron beam evaporation," Beilstein J. Nanotechnol, Mar. 21, 2015.
Ahmadi et al., "Resistive Switching in Individual Co/ZnO Core/Shell Nanoparticles Formed via Inert Gas Condensation and Selective Oxidation," Advanced Electronic Materials, 2020.
Chen et al., "Resistive Switching and Magnetic Modulation in Cobalt-Doped ZnO," Advanced Materials, 2012.
Mallinson et al., "Avalanches and criticality in self-organized nanoscale networks," Science Advances, Nov. 1, 2019.
Sokolov et al., "Bio-realistic synaptic characteristics in the cone-shaped ZnO memristive device," NPG Asia Materials, 2019.
Li et al., "Direct Observations of Nanofilament Evolution in Switching Processes in HfO2-Based Resistive Random Access Memory by In Situ TEM Studies," Advanced Materials, 2017.
Rohde et al., "Identification of a determining parameter for resistive switching of thin films," Appl. Phys. Lett., Jun. 23, 2005.
Porter et al., "Phase Transformations in Metals and Alloys," CRC Press, 2009.
Llamosa et al., "The ultimate step towards a tailored engineering of core@shell and core@shell@shell nanoparticles," Nanoscale, Aug. 11, 2014.
Schmidt et al., "Resistive Switching of Individual, Chemically Synthesized TiO 2 Nanoparticles," Small Journal, 2015.
Mukherjee et al., "Direct gas-phase formation of complex core-shell and three-layer Mn—Bi nanoparticles," The Royal Society of Chemistry, 2016.
Patiño et al., "Experimental determination of tunneling characteristics and dwell times from temperature dependence of Al/Al2O3/Al junctions," Applied Physics Letters, 2015.
Zograf et al., "Laser printing of Au/Si core-shell nanoparticles," Journal of Physics Conference Series, 2016.
Burr et al., "Emerging materials in neuromorphic computing: Guest editorial," APL Materials, Jan. 17, 2020.
Haberland ct al., "Thin films from energetic cluster impact: A feasibility study," J. Vac. Sci. Technol. A, 1992.
Shima et al., "Voltage polarity dependent low-power and high-speed resistance switching in CoO resistance random access memory with Ta electrode," Applied Physics Letters, 2008.
Guo et al., "Colloidal core-shell materials with 'spiky' surfaces assembled from gold nanorods," Chem. Commun., May 19, 2014.
Fang et al., "Approaching Gas Phase Electrodeposition: Process and Optimization to Enable the Self-Aligned Growth of 3D Nanobridge-Based Interconnects," Adv. Mater., 2016.
Yang et al., "The mechanism of electroforming of metal oxide memristive switches," Nanotechnology, Mar. 9, 2009.
Cruz-Albrecht et al., "A scalable neural chip with synaptic electronics using CMOS integrated memristors," Nanotechnology, 2013.
Qi et al., "Resistive Switching in Single Epitaxial ZnO Nanoislands," Jan. 18, 2012.
Choi et al., "Different resistance switching behaviors of NiO thin films deposited on Pt and SrRuO3 electrodes," Applied Physics Letters, 2009.
Vernieres et al., "Site-Specific Wetting of Iron Nanocubes by Gold Atoms in Gas-Phase Synthesis," Adv. Sci., 2019.
Mattei et al., "Gas-Phase Synthesis of Trimetallic Nanoparticles," CM Chemistry of Materials, 2019.
Fujiwara et al., "Resistance Switching and Formation of a Conductive Bridge in Metal/Binary Oxide/Metal Structure for Memory Devices," Japanese Journal of Applied Physics, Nov. 8, 2008.
Kim et al., "The conical shape filament growth model in unipolar resistance switching of thin film," Appl. Phys. Lett. Mar. 26, 2009.
Nagashima et al., "Resistive Switching Multistate Nonvolatile Memory Effects in a Single Cobalt Oxide Nanowire," Nano Letters, 2010.
Sattler et al., "Generation of Metal Clusters Containing from 2 to 500 Atoms," Physical Review Letters, Sep. 8, 1980.
Grammatikopoulos et al., "Kinetic trapping through coalescence and the formation of patterned Ag—Cu nanoparticles," Nanoscale, Apr. 8, 2016.
Lin et al., "Microplasma: A New Generation of Technology for Functional Nanomaterial Synthesis," Plasma Chem Plasma Process, 2015.
Martínez et al., "Generation of Nanoparticles with Adjustable Size and Controlled Stoichiometry: Recent Advances," Langmuir, 2012.
Vitos et al., "The surface energy of metals," Surface Science, 1998.
Shirai et al., "Long-range temporal correlations in scale-free neuromorphic networks," Network Neuroscience, Jan. 17, 2020.
Zhao et al., "Low power consumption bipolar resistive switching characteristics of ZnO-based memory devices," Chinese Optics Letters, Jan. 10, 2012.
Duncan, "Invited Review Article: Laser vaporization cluster sources," Review of Scientific Instruments, Apr. 12, 2012.
Rozenberg et al., "Mechanism for bipolar resistive switching in transition-metal oxides," Physical Review, 2010.
Sanaee et al., "Synthesis of Carbon Encapsulated Mono- and Multi-Iron Nanoparticles," Journal of Nanomaterials, 2015.
Lee et al., "Electrical Manipulation of Nanofilaments in Transition-Metal Oxides for Resistance-Based Memory," Nano Letters, Feb. 10, 2009.
Hagan et al., "Mechanisms of kinetic trapping in self-assembly and phase transformation," The J. Chem. Phys., Sep. 14, 2011.
Wang et al., "Memristors with diffusive dynamics as synaptic emulators for neuromorphic computing," Nature Materials, vol. 16, Jan. 2017.
Burr et al., "Neuromorphic computing using non-volatile memory," Advances in Physics: X, 2017.
Mirigliano et al., "Non-ohmic behavior and resistive switching of Au cluster-assembled films beyond the percolation threshold," Nanoscale Advances, 2019.
Kylián et al., "Magnetron Sputtering of Polymeric Targets: From Thin Films to Heterogeneous Metal/Plasma Polymer Nanoparticles," Materials, 2019.
Pan et al., "Nonvolatile resistive switching memories-characteristics, mechanisms and challenges," ScienceDirect, Oct. 23, 2010.
Mukherjee et al., "Formation of non-equilibrium Fe—Au solid solutions in Nanoclusters," Research Article, Jun. 18, 2013.

(56) References Cited

OTHER PUBLICATIONS

Fuller et al., "Parallel programming of an ionic floating-gate memory array for scalable neuromorphic computing," Science, May 10, 2019.
Sattar et al., "Quantized conductance and switching in percolating nanoparticle films," Physical Review Letters, Sep. 27, 2013.
Ghosh et al., "Core/Shell Nanoparticles: Classes, Properties, Synthesis Mechanisms, Characterization, and Applications," Chemical Reviews, vol. 112, pp. 2373-2433, 2012.
Bukka et al., "Ultrafast electrochemical deposition of core shell metal nanoparticles on TiO2 nanotubes for electrocatalytic applications," IPO Publishing, Sep. 7, 2018.
Chang et al., "Occurrence of Both Unipolar Memory and Threshold Resistance Switching in a NiO Film," Physical Review Letters, Jan. 16, 2009.
Bose et al., "Synaptic dynamics in complex self-assembled nanoparticle networks," The Royal Society of Chemistry, Aug. 10, 2018.
Kaviani et al., "Electroactive and Conformal Coatings of Oxidative Chemical Vapor Deposition Polymers for Oxygen Electroreduction," ACS Applied Polymer Materials, 2019.
Seo et al., "Reproducible resistance switching in polycrystalline NiO Films," Applied Physics Letters, vol. 85, No. 23, Dec. 6, 2004.
Wei et al., "Multifunctional composite core-shell nanoparticles," Nanoscale, pp. 4474-4502, Sep. 4, 2011.
Srdić et al., "Recent progress on synthesis of ceramics core/shell Nanostructures," Processing and Application of Ceramics, pp. 45-62, 2013.
Bouwen et al., "Production of bimetallic clusters by a dual-target dual-laser vaporization source," Review of Scientific Instruments, vol. 71, No. 1, Jan. 2000.
Yang et al., "Switching mechanism transition induced by annealing treatment in nonvolatile Cu/ZnO/Cu/ZnO/Pt resistive memory: From carrier trapping/detrapping to electrochemical metallization," J. Appl. Phys., Dec. 29, 2009.
Chen et al., "Ultra-fast self-assembly and stabilization of reactive nanoparticles in reduced graphene oxide films," Nature Communications, Aug. 12, 2016.
Lai et al., "Resistive Switching of Plasma-Treated Zinc Oxide Nanowires for Resistive Random Access Memory," nanomaterials, Jan. 13, 2016.
Santos et al., "A novel structure ZnO—Fe—ZnO thin film memristor," Materials Science in Semiconductor Processing, pp. 43-48, 2018.
Yang et al., "Complementary resistive switching in tantalum oxide-based resistive memory devices," Applied Physics Letters, 2012.

* cited by examiner

CORE/SHELL NANOPARTICLE-BASED DEVICES FOR SENSORS AND NEUROMORPHIC COMPUTING

CROSS-REFERENCE TO RELATED APPLICATIONS

This application is a continuation of PCT International Application No. PCT/US2021/046319, filed Aug. 17, 2021, which claims the benefit of priority to U.S. Provisional Patent Application No. 63,067,002, filed Aug. 18, 2020, and to U.S. Provisional Patent Application No. 63,087,421, filed Oct. 5, 2020, each of which is hereby incorporated by reference in its entirety.

STATEMENT REGARDING FEDERALLY SPONSORED RESEARCH OR DEVELOPMENT

This invention was made with Government support under Grant No. DMR1420645 awarded by the National Science Foundation. The Government has certain rights in the invention.

BACKGROUND OF INVENTION

The development of non-volatile memory has long motivated pursuit of alternative designs and materials for scalability and low energy consumption. In that direction, Resistive Random-Access Memory (RRAM) has attracted considerable attention due to its simple capacitor-like configuration of metal/active layer/metal, low power consumption and high speed. Electric field-induced resistance switching in transition metal oxides is attractive due to simple composition and adjustable stoichiometry of the oxide thin film. Furthermore, resistive switching has been observed in polycrystalline transition metal oxide thin films which eliminates the need for single-crystalline materials and related deposition challenges. Decreasing the scale of the non-volatile resistive switching memristor is strongly desired. Nanoscale memristors have been considered as building blocks of neuromorphic computational systems which operate on brain-like principles. However, complex and critical interconnections (synaptic connections) between building blocks are necessary to achieve the highest computational performance. Many designs using resistive switching materials retain von Neumann architectures using, for example, arrays and grids. With these architectures, large amounts of data are transferred back and forth along the same pipelines, creating bottlenecks and power inefficiencies. Nanoparticle-based architectures offer the possibility of bio-inspired neuronal networks.

Core/shell nanostructures possess multifunctional properties due to their combining multiple components within one nanoscale object to result in new behavior. In addition to multifunctionality of core/shell nanostructures, an appropriate selection of shell material can help to improve dispersibility, reactivity, thermal stability, or oxidative stability of the core material. Thus, various methods have been developed for synthesizing core/shell nanostructures offering different core size, shell thickness, morphology, shape and compositions. These methods generally fall into two categories: liquid-based techniques (e.g., colloidal aggregation, sol-gel, or electrochemical deposition), and gas phase aggregation processes (e.g., chemical vapor deposition, inert gas condensation, or laser printing). The gas phase aggregation method is attracting interest due to its ability to work in high or ultrahigh vacuum environments, which guarantees the chemical purity of the nanoparticles and is compatible with device fabrication via conventional lithographic techniques. Gas phase aggregation techniques are based on nucleation and growth of nanoparticles from the saturated vapor phase of elements, with many techniques for producing the vapor phase such as arc discharge, pulsed microplasma, laser vaporization, Joule heating, or sputtering.

SUMMARY OF THE INVENTION

Provided herein are nanoparticles comprising a core and a shell (i.e., core/shell nanoparticles) each of which can individually exhibit bipolar resistive switching behavior in response to an applied voltage or current. Optionally, the bipolar resistive switching occurs without electroforming. Also disclosed herein are networks of core/shell nanoparticles and devices, comprising a network of core/shell nanoparticles, that are characterized by bipolar resistive switching behavior in response to an applied voltage or current. The devices that may be resistive switching devices, artificial synapses, artificial neural networks, non-transitory computer-readable media, sensors, or any combinations of these. Further provided herein is a method of using the devices disclosed herein and methods for making the core/shell nanoparticles. For example, the core/shell nanoparticles can be made by forming multi-material nanoclusters in gas and then oxidizing the nanoclusters, which results in forming an oxide shell material. For example, two methods of forming an oxide shell (ex situ and in situ) are described.

Aspects disclosed herein include a core/shell nanoparticle comprising: a metallic core; a shell formed of a metal oxide and surrounding the metallic core; wherein the nanoparticle is characterized by bipolar resistive switching in response to an applied voltage or current. Preferably but not necessarily, the shell fully envelopes the entirety of the core or in other words surrounds 100% of the core. Preferably, the shell surrounds a majority of the core. Optionally, in any embodiment, the core comprises Co or is consisting essentially of Co. Optionally, in any embodiment, the core comprises Co. Optionally, in any embodiment, the core consists essentially of Co. Optionally, in any embodiment, the shell comprises ZnO or is consisting essentially of ZnO. Optionally, in any embodiment, the shell comprises ZnO. Optionally, in any embodiment, the shell consists essentially of ZnO. Optionally, in any embodiment, the metal oxide is a dielectric material. Optionally, in any embodiment, the shell is characterized by electroforming-free bipolar resistive switching in response to the applied voltage or current. Optionally, in any embodiment, the shell is a single crystal. Optionally, in any embodiment, an interface between the core and the shell is at least partially epitaxial. Optionally, in any embodiment, at least a portion, such as but not necessarily at least 25%, at least 50%, at least 75%, or at least 90%, of an interface between the core and the shell is epitaxial. Optionally, in any embodiment, an interface between the core and the shell is characterized by dislocations every 5 Å or more in the core, a magnitude of a Burgers vector of dislocations of less than or equal to 3 Å, and/or a lattice mismatch less than or equal to 60%. Optionally, in any embodiment, an interface between the core and the shell is characterized by dislocations every 5 Å or more in the core, optionally every 6 Å or more in the core. Optionally, in any embodiment, an interface between the core and the shell is characterized by a magnitude of a Burgers vector of dislocations of less than or equal to 3 Å, optionally selected from the range of 1 Å to 3 Å. Optionally, in any embodiment, an interface between the core and the shell is characterized by a lattice mismatch less than or equal to 60%, optionally less than or equal to 50%, optionally less than or equal to 40%. Optionally, in any embodiment, an interface between the core and the shell is characterized by dislocations every 4 to 6 Å in the core, a magnitude of a Burgers vector of dislocations selected from the range of 2 Å to 3 Å, and/or a lattice mismatch selected from the range of 40% to 60%. Optionally, in any embodiment, the core/shell nanoparticle has a diameter selected from the range of 3 nm to 100 nm, optionally 3 nm to 80 nm, optionally 3 nm to 60 nm, optionally 4 nm to 50 nm, optionally 4 nm to 80 nm, optionally 4 nm to 60 nm. Optionally, in any embodiment, the core has a face centered cubic or a hexagonal closed packed crystal structure. Optionally, in any embodiment, the core has a face centered cubic. Optionally, in any embodiment, the core has a hexagonal closed packed crystal structure. Optionally, in any embodiment, the shell has a hexagonal closed packed crystal structure. Optionally, in any embodiment, the nanoparticle's bipolar resistive switching is characterized by a memory window of greater than or equal to 300; wherein the memory window corresponds to a ratio of a resistance at a high resistance state (HRS) at a given voltage to a resistance at a low resistance state (LRS) at the given voltage. Optionally, in any embodiment, the nanoparticle's bipolar resistive switching is characterized by a memory window of greater than or equal to 500, optionally greater than or equal to 1000, optionally greater than or equal to 1500, optionally greater than or equal to 3000.

Aspects disclosed herein include a device comprising: a positive electrode; a negative electrode; a nanoparticle network in electronic communication with the positive electrode and the negative electrode; wherein the nanoparticle network comprises: a plurality of core/shell nanoparticles, each core/shell nanoparticle of the network being a core/shell nanoparticle according any embodiment or any combination of embodiments disclosed herein; wherein the negative and positive electrodes are in electronic communication with each other via the nanoparticle network; wherein the device is characterized by bipolar resistive switching in response to an applied voltage or current. Optionally, in any embodiment of a device or nanoparticle network disclosed herein, the device or nanoparticle network is characterized by electroforming-free bipolar resistive switching in response to the applied voltage or current. Optionally, in any embodiment of a device or nanoparticle network disclosed herein, the device is characterized by electroforming-free bipolar resistive switching in response to the applied voltage or current. Optionally, in any embodiment of a device or nanoparticle network disclosed herein, the nanoparticle network comprises two or more unique current-conduction pathways between the positive electrode and the negative electrode. Optionally, in any embodiment of a device or nanoparticle network disclosed herein, a first portion of the nanoparticle network is in physical contact with the positive electrode and a second portion of the nanoparticle network is in physical contact with the negative electrode, wherein the first portion and the second portion of the nanoparticle network are at least partially mutually exclusive or non-overlapping in physical space. Optionally the first portion and the second portion of the nanoparticle network are fully mutually exclusive or non-overlapping in physical space. Optionally, in any embodiment of a device or nanoparticle network disclosed herein, current conduction in the nanoparticle network is characterized by Ohmic conduction, Child's square law conduction, and/or space-charge-limited conduction. Optionally, in any embodiment of a device or nanoparticle network disclosed herein, current conduction in the nanoparticle network is characterized by Ohmic conduction. Optionally, in any embodiment of a device or nanoparticle network disclosed herein, the plurality of core/shell nanoparticles have a ratio of standard deviation of size to average size of 0.4 or less, optionally 0.3 or less, optionally selected from the range of 0.1 to 0.4. Optionally, in any embodiment of a device or nanoparticle network disclosed herein, the plurality of core/shell nanoparticles have an average size selected from the range of 3 nm to 100 nm, optionally 3 nm to 80 nm, optionally 3 nm to 60 nm, optionally 4 nm to 50 nm, optionally 4 nm to 80 nm, optionally 4 nm to 60 nm, optionally 4 nm to 10 nm. Optionally, in any embodiment of a device or nanoparticle network disclosed herein, the device is a resistive switching device, an artificial synapse, a non-transitory computer-readable media, a sensor, or a combination of these.

Aspects disclosed herein also include a non-transitory computer-readable media comprising a device according to any embodiment or combination of embodiments disclosed herein. Aspects disclosed herein also include an artificial neural network comprising a device according to any embodiment or combination of embodiments disclosed herein.

Aspects disclosed herein also include a method of using the device according to any embodiment or combination of embodiments disclosed herein, the method comprising steps of: applying a voltage or current between the negative electrode and the positive electrode; and detecting a resistance between the negative electrode and the positive electrode.

Aspects disclosed herein also include a method for making a core/shell nanoparticle according to any embodiment or combination of embodiments disclosed herein, the method of making comprising steps of: forming nanoclusters dispersed in a gas; wherein each nanocluster comprises a first material and a second material; depositing the nanoclusters on a substrate; and oxidizing the second material of each nanocluster, thereby forming the nanoparticle, wherein the core comprises the first material and the shell comprises the second material. The first material and the second material are preferably of differing compositions (e.g., each a different metal element or different combination of metal elements) with respect to each other. Optionally, in any method of making disclosed herein, the forming step comprises sputtering the nanoclusters of a target comprising the first material and the second material. Optionally, in any method of making disclosed herein, the gas is an inert gas. Optionally, in any method of making disclosed herein, the oxidizing step is performed only after the depositing step is complete. Optionally, in any method of making disclosed herein, (i) the oxidizing step is performed during the forming step or (ii) the oxidizing step is performed during the forming step and after the depositing step. Optionally, in any method of making disclosed herein, the oxidizing step is performed during the forming step. Optionally, in any method of making disclosed herein, the oxidizing step is performed during the forming step and after the depositing step. Optionally, in any method of making disclosed herein, the first material is Co and the second material is Zn and/or ZnO. Optionally, in any method of making disclosed herein, the first material is Co. Optionally, in any method of making disclosed herein, the second material is Zn and/or ZnO.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

FIG. 4A: Low magnification TEM image and (FIG. 4B) size distribution fitted with Gaussian curve. FIG. 4C: HRTEM image with FFT shown in the inset, which indexed to the zone axis of an hcp structure. FIG. 4D: HAADF-STEM image; (FIG. 4E) elemental map, and (FIG. 4F) compositional profile across the line shown in FIG. 4E.

FIG. 5A: Low magnification TEM image and (FIG. 5B) size distribution fitted with a Gaussian curve. FIG. 5C: HRTEM image; inset is showing hcp polycrystalline structure of ZnO with FFT rings and fcc structure of Co with zone axis [001]. FIG. 5D: HAADF-STEM image. FIG. 5E: EDS elemental mapping and (FIG. 5F) line scan plots showing the compositional profile across the particle diameter.

FIG. 6A: Low magnification TEM images and (FIG. 6B) size distribution fitted with a Gaussian curve. FIG. 6C: HRTEM image; inset shows the FFT. FIG. 6D: HAADF-STEM image. FIG. 6E: EDS elemental map, and (FIG. 6F) line scan showing the composition across the nanoparticle diameter.

STATEMENTS REGARDING CHEMICAL COMPOUNDS AND NOMENCLATURE

Figure 1A:
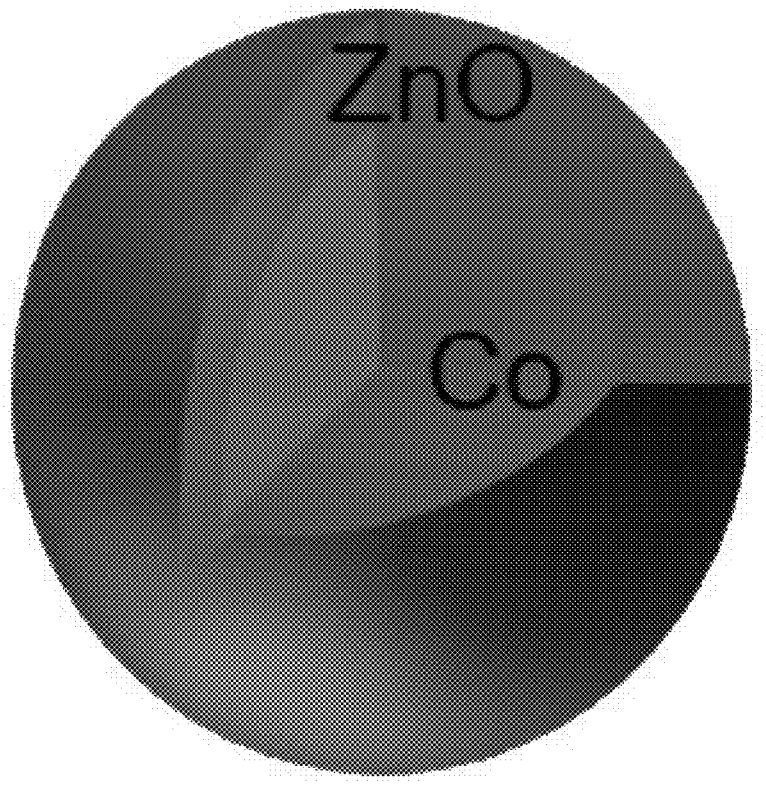
FIG. 1A: Schematic representation of a Co core/ZnO shell nanoparticle.

In general, the terms and phrases used herein have their art-recognized meaning, which can be found by reference to standard texts, journal references and contexts known to those skilled in the art. The following definitions are provided to clarify their specific use in the context of the invention.

The term "core/shell nanoparticle" is intended to be consistent with the term as known in the field of materials science, and generally refers to a nanoparticle comprising a core or inner portion and a shell or outer portion, wherein the core has a different composition and/or a different crystallographic structure than the shell. Generally, but not necessarily, the core has a different composition than the shell. The shell at least partially surrounds the core. Generally, but not necessarily, the shell surrounds a majority of the core or envelopes the entirety of the core. A core/shell nanoparticle has one or more shells or shell layers. Optionally, a core/shell nanoparticle has one shell. Optionally a core/shell nanoparticle has a plurality of shells or shell layers. For example, a core/shell nanoparticle according to embodiments herein comprises a metallic core and a metal oxide shell, wherein the core material has a composition (i.e., metallic) that is different from a composition of the shell (i.e., metal oxide).

As used herein, the term "nanoparticle" is intended to be consistent with the term as known in the field of materials science, and generally refers to a physical particle having at least one size characteristic or physical dimension less than 1 μm. Preferably, term "nanoparticle" as used herein, refers to a physical particle whose longest size characteristic or physical dimension is less than 1 μm.

The term "size characteristic" refers to a property, or set of properties, of a particle that directly or indirectly relates to a size attribute. According to some embodiments, a size characteristic corresponds to an empirically-derived size characteristic of a particle(s) being detected, such as a size characteristic based on, determined by, or corresponding to data from any technique or instrument that may be used to determine a particle size, such as but not limiting to electron microscope (e.g., SEM and TEM), optical attenuation (absorbance, scattering, and/or reflectance), and/or a light scattering technique (e.g., DLS). For example, a size characteristic can correspond to a spherical particle exhibiting similar or substantially same properties, such as aerodynamic, hydrodynamic, optical, and/or electrical properties, as the particle(s) being detected. According to some embodiments, a size characteristic corresponds to a physical dimension, such as a cross-sectional size (e.g., length, width, thickness, or diameter).

The term "metal element" refers to a metal element of the periodic table of elements. Optionally, as used herein, the term "metal element" includes elements that are metalloids. Metalloids elements include B, Si, Ge, As, Sb, and Te. Optionally, metalloid elements include B, Si, Ge, As, Sb, Te, Po, At, and Se. The term "transition metal element" refers to a metal element from the category of transition metal elements (preferably an element whose atom has a partially filled d sub-shell, or which can give rise to cations with an incomplete d sub-shell) of the Periodic Table of Elements, including lanthanide and actinide elements. The term "metallic" is intended to be consistent with the term as known in the field of materials science, and generally refers to a material composition that behaves as or is characterized as a metal or metal alloy when in bulk form as would be so recognized by one of skill in the art. As an illustrative non-limiting example, referring to properties, behavior, or characteristics of a material in bulk form may refer to the material's bulk or non-surface properties, behavior, or characteristics if said material were in the form of a three-dimensional solid (e.g., particle, sphere, cube; e.g., not in form of a microscale/nanoscale thin film, microparticle, or nanoparticle) with a volume of ≥1 $cm^3$. The term "metallic" refers to a composition comprising, consisting essentially of, or consisting of one or more metal elements. Optionally, the term "metallic" refers to a composition consisting essentially of of one or more metal elements. Optionally, the term "metallic" refers to a composition characterized by a chemical formula consisting of one or more metal elements. Optionally, the term "metallic" refers to a composition consisting of one or more metal elements.

The term "metal oxide" generally refers to a material whose chemical composition comprises one or more metal elements and the element O. Optionally, a metal oxide material is an ionic material or at least partially an ionic material wherein at least a fraction of the chemical bonding is characterized as ionic bonding.

The term "metal alloy" refers to a composition characterized as an alloy of two or more metals. For example, a metal alloy may be characterized as a solid solution of two or more metal elements (e.g., the metal elements being in the form of atoms or ions in the solid solution), a mixture of metallic phases, or an intermetallic compound. A metal alloy can be characterized as comprising metallic bonding. In certain embodiments, a metal, rather than a metal alloy, refers to a metallic material whose chemical formula has one metal element (i.e., its compositions has substantially or essentially one metal element).

The term "bipolar resistive switching" is intended to be consistent with the term as known in the fields of materials science and electrical engineering. The term "resistive switching" generally refers to the physical phenomena where a dielectric suddenly changes its (two-terminal) resistance under the action of an electric field or current. The change of resistance is non-volatile and reversible. Traditionally, resistive switching systems are capacitor-like devices, where the electrode is an ordinary metal and the dielectric a transition metal oxide. An application of resistive switching is the fabrication of non-volatile resistive random-access memories (RRAM). This effect is also at the base of the behavior of the so called memristor devices and neuromorphic memories. Additional discussion of bipolar resistive switching may be found in the following reference which is incorporated herein by reference in its entirety: J. Zhao, F. Liu, J. Sun, H. Huang, Z. Hu, X. Zhang, "Low power consumption bipolar resistive switching characteristics of ZnO-based memory devices," Chin. Opt. Lett. 10, 013102 (2012).

The term "electroforming" is intended to be consistent with the term as known in the fields of materials science and electrical engineering. Electroforming, which is a process that occurs in many resistive switching devices, refers a high-voltage nondestructive breakdown which activates the device for resistive switching behavior by generating vacancies or conductive paths. Preferably, but not necessarily, electroforming does not occur or is not necessary for bipolar resistive switching behavior to occur or be observed in the core/shell nanoparticles and devices disclosed herein. The avoidance of electroforming here is significant, as it is beneficial in realization of high-density resistive random access memory applications. Additional discussion of electroforming may be found in the following references, each of which is incorporated herein by reference in its entirety: (1) P. A. N. Feng, C. Chao, Z. Wang, Y. Yang, Y. Jing, Z. Fei, Prog. Nat. Sci. Mater. Int. 2010, 20, 1; and (2) Y. C. Yang, F. Pan, F. Zeng, M. Liu, *J. Appl. Phys.* 2009, 106, 123705.

The term "memory window" refers to a characteristic of resistive switching such as bipolar resistive switching. The memory window corresponds to a ratio of a resistance at a high resistance state (HRS) at a given voltage to a resistance at a low resistance state (LRS) at the given voltage. More particularly, the memory window may be characterized as the ratio Roff/Ron, wherein Roff and Ron are resistances of HRS and LRS, respectively. Additional discussion of memory window may be found in the following references, each of which is incorporated herein by reference in its entirety: (1) K. Nagashima, T. Yanagida, K. Oka, M. Taniguchi, T. Kawai, J.-S. Kim, B. H. Park, *Nano Lett.* 2010, 10, 1359; (2) J. Zhao, F. Liu, J. Sun, H. Huang, Z. Hu, X. Zhang, Chin. *Opt. Lett.* 2012, 10, 013102; and (3) G. Chen, C. Song, C. Chen, S. Gao, F. Zeng, F. Pan, *Adv. Mater.* 2012, 24, 3515.

The term "nanoparticle network" refers to a network, arrangement, or grouping of nanoparticles of a plurality of nanoparticles in electrical communication with each other via each other. For example, a nanoparticle network may be in the form of a layer, film, or coating of a plurality of nanoparticles that are in electrical communication with each other. Generally, but not necessarily, each individual nanoparticle in a nanoparticle network is independently in direct electrical communication with at least one other nanoparticle of the same nanoparticle network.

The term "electrical communication" refers to the arrangement of two or more materials or items such that electrons can be transported to, past, through, and/or from one material or item to another. Electrical communication between two materials or items can be direct or indirect through another one or more materials or items. Generally, materials or items in electrical communication are electrically conducting or semiconducting.

The term "current-conduction pathway" refers to path or trace by which electrons may be and are capable of being conducted or transported between two physical points or objects, such as between a positive electrode and a negative electrode. In a nanoparticle network, any current-conduction pathway includes conduction or transport of electrons between any two or more nanoparticles, of said network, that are in electrical communication with each other. In a nanoparticle network, a current-conduction pathway may correspond, at least in part, to a series of nanoparticles between/among which electrons may conduction, transport, or hop between a positive electrode and a negative electrode. For example, a current-conduction pathway may involve conduction or transport of electrons by Ohmic conduction, Child's square law conduction, and/or space-charge-limited conduction. For example, in nanoparticle network, a current-conduction pathway may include a path or series of nanoparticles by which electrons may hop between/among nanoparticles between a positive electrode and a negative electrode.

The term "±" refers to an inclusive range of values, such that "X±Y," wherein each of X and Y is independently a number, refers to an inclusive range of values selected from the range of (X−Y) to (X+Y).

The term "and/or" is used herein, in the description and in the claims, to refer to a single element alone or any combination of elements from the list in which the term and/or appears. In other words, a listing of two or more elements having the term "and/or" is intended to cover embodiments having any of the individual elements alone or having any combination of the listed elements. For example, the phrase "element A and/or element B" is intended to cover embodiments having element A alone, having element B alone, or having both elements A and B taken together. For example, the phrase "element A, element B, and/or element C" is intended to cover embodiments having element A alone, having element B alone, having element C alone, having elements A and B taken together, having elements A and C taken together, having elements B and C taken together, or having elements A, B, and C taken together.

In an embodiment, a composition or compound of the invention, such as an alloy or precursor to an alloy, is isolated or substantially purified. In an embodiment, an isolated or purified compound is at least partially isolated or substantially purified as would be understood in the art. In an embodiment, a substantially purified composition, compound or formulation of the invention has a chemical purity of 95%, optionally for some applications 99%, optionally for some applications 99.9%, optionally for some applications 99.99%, and optionally for some applications 99.999% pure.

DETAILED DESCRIPTION OF THE INVENTION

In the following description, numerous specific details of the devices, device components and methods of the present invention are set forth in order to provide a thorough explanation of the precise nature of the invention. It will be apparent, however, to those of skill in the art that the invention can be practiced without these specific details.

There is increasing interest in bio-realistic neural networks which more accurately mimic the synapse process, especially to impact the development of neuromorphic computing. From a materials perspective, non-volatile memory, including resistive switching materials, have many of the attributes necessary for neuromorphic computing, primarily distinct "on" and "off" states that can be quickly reversed with low power consumption. However, device architecture is challenging. Many designs using resistive switching materials retain von Neumann architectures using, for example, arrays and grids. With these architectures, large amounts of data are transferred back and forth along the same pipelines, creating bottlenecks and power inefficiencies [5]. Nanoparticle-based architectures offer the possibility of bio-inspired neuronal networks. These nanoparticle-based systems can display resistive switching behavior. For example, a network of highly defected Au nanoparticles displayed resistive switching behavior despite the normally high conductivity of Au. Percolated systems of Sn nanoparticles also show quantized conductance and switching [6,7] and displayed neuromorphic tendencies. In this case, the nanoparticle system is just below the percolation limit, and the applied voltage induces necking to complete the conductive path [6].

Figure 1B:
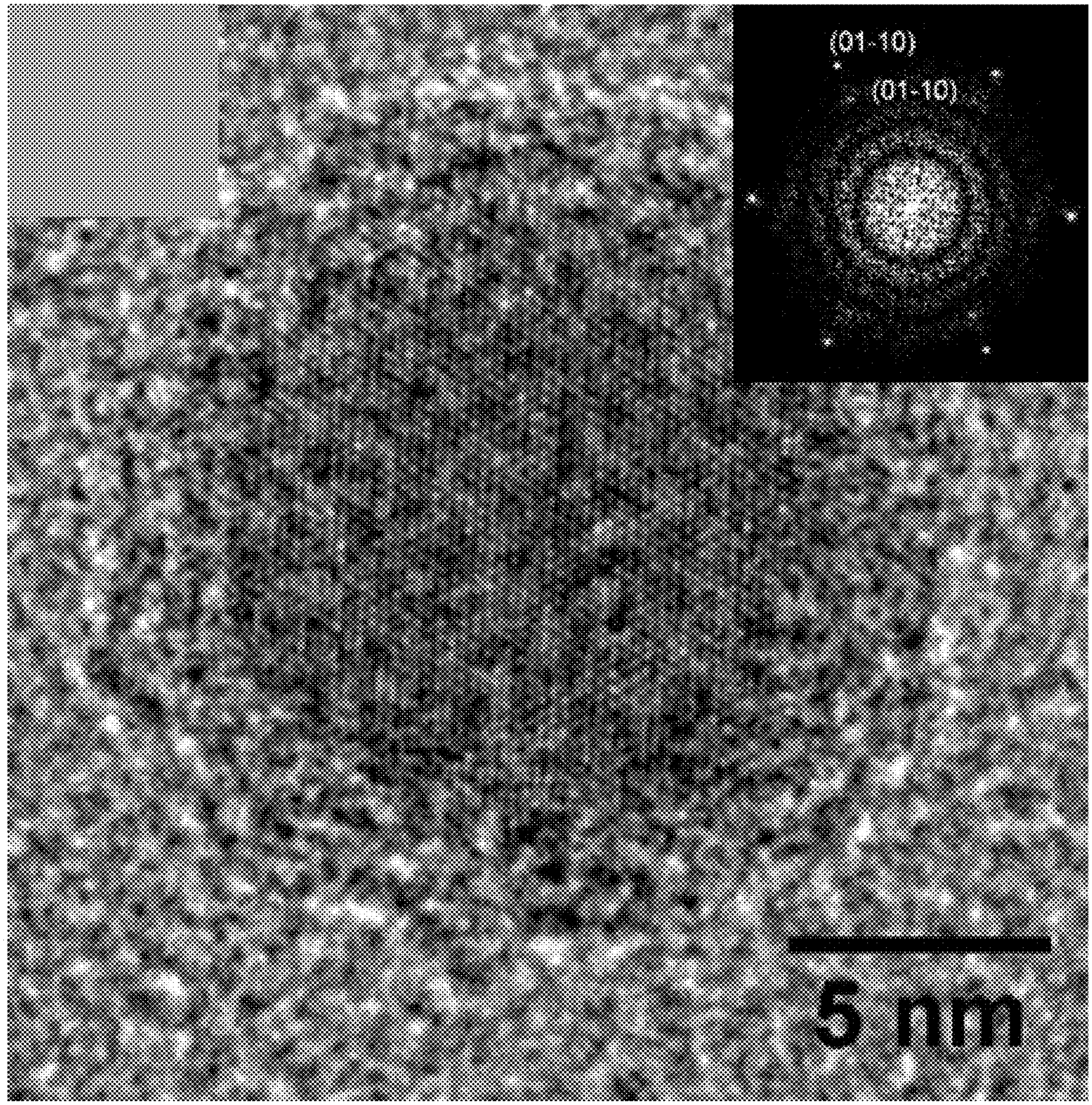
FIG. 1B: High-resolution transmission electron micrograph of the Co/ZnO core/shell nanoparticle. The inset shows the FFT. Here, the hcp Co core and the hop ZnO shell have a distinct orientation relationship, and both are single-crystalline.
Figure 1C:
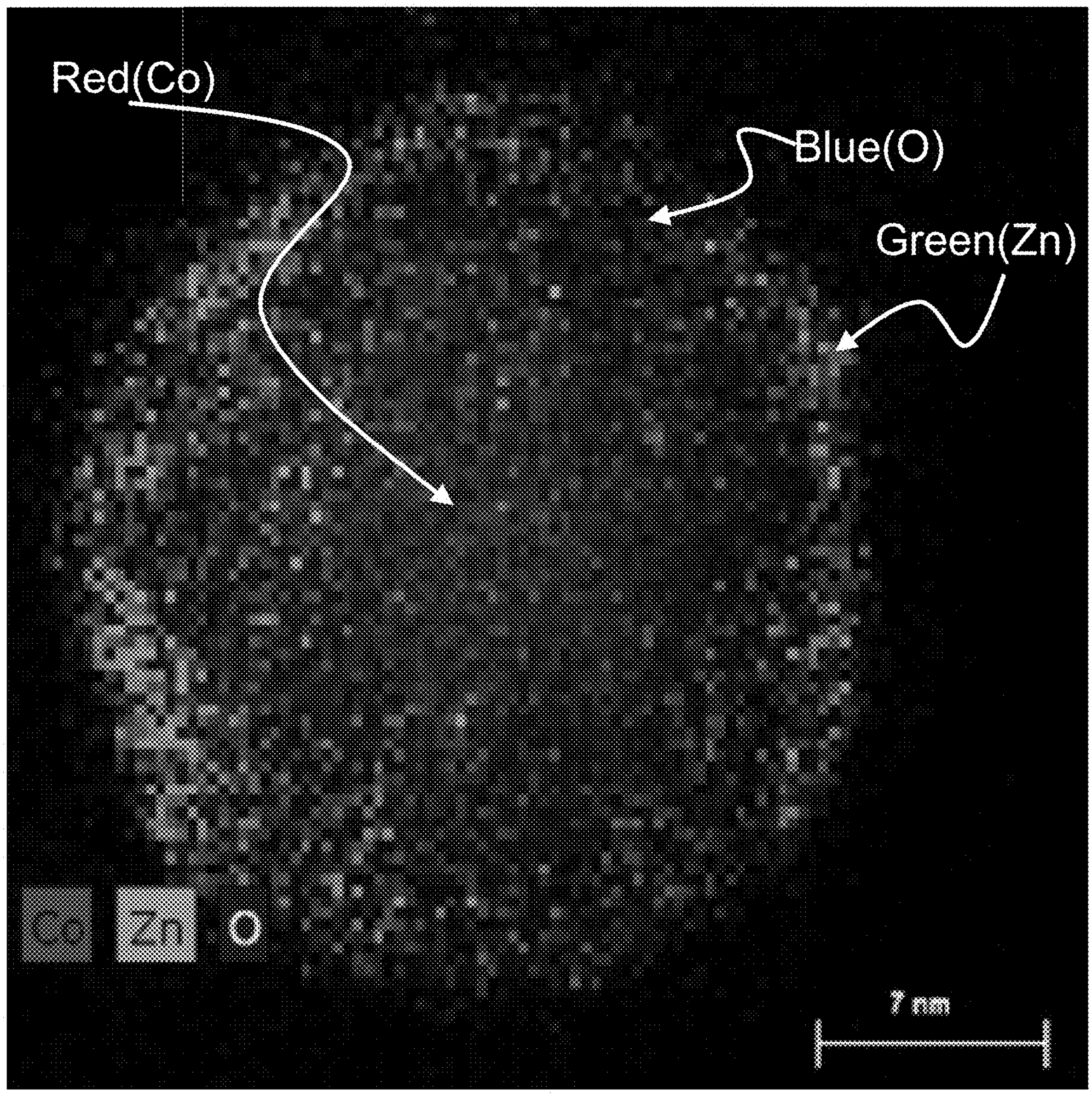
FIG. 1C: X-ray map of the core/shell nanoparticle showing the ZnO shell and Co core.
Figure 1D:
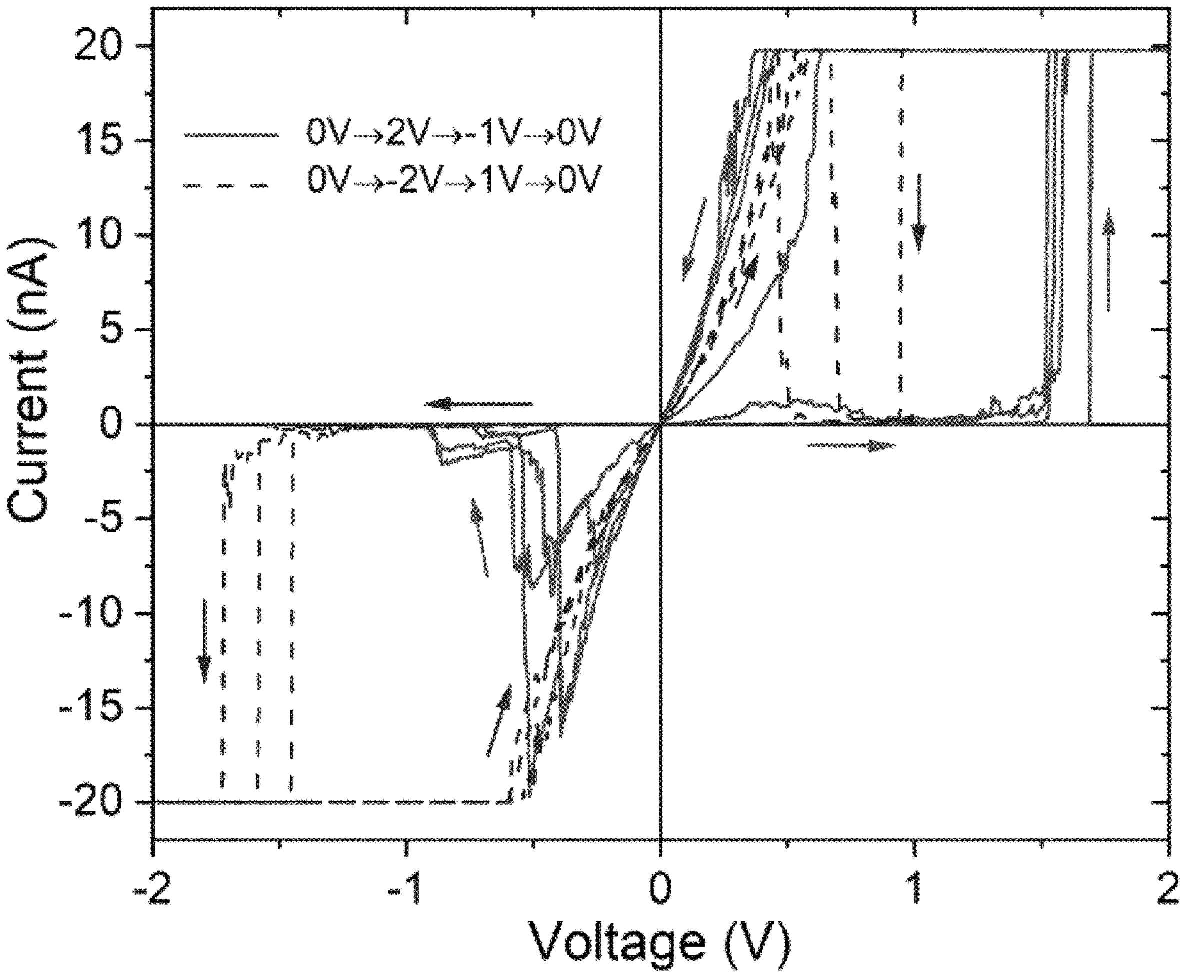
FIG. 1D: I-V curve of an individual nanoparticle showing resistive switching behavior with distinct "on" and "off" states. The red (solid) and blue (dashed) curves are measurements done with different polarities. Multiple cycles were completed in both directions.

Disclosed herein are devices which combine the attributes of non-volatile memory, in this case resistive switching materials, in a nanoparticle network. Core/shell nanoparticle are disclosed which individually displays resistive switching behavior. For example, inert gas condensation (IGC) is used to produce Co/ZnO core/shell nanoparticles. By introducing oxygen into the nucleation chamber, the Zn on the surfaces is preferentially oxidized, resulting in a ZnO shell and a Co core. ZnO is a common resistive switching material (FIGS. 1A-1C). The electrical behavior of individual nanoparticles was measured using conductive atomic force microscopy (c-AFM), and the I-V curves displayed resistive switching behavior with high- and low-resistance states (on and off states) (FIG. 1D). The resistance ratio was approximately 3600, much higher than observed in other ZnO memristive materials. Note that no electroforming process was required, according to embodiments. The conduction mechanism may include the formation of conducting bridges within the ZnO layers, and the Co core likely provides a conductive path once the ZnO becomes conductive. The Co may also provide magnetic modulation [13].

Figure 2A:
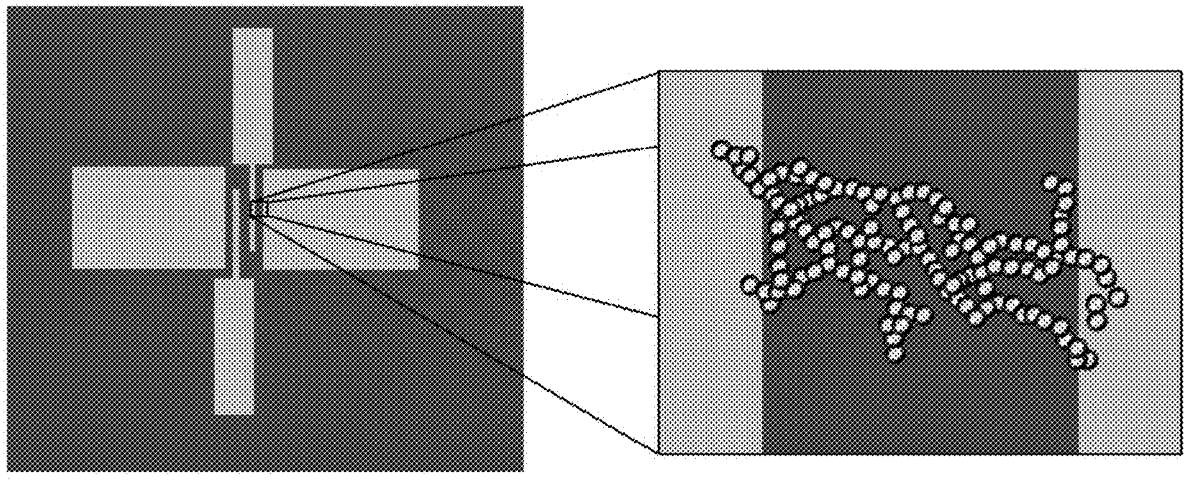
FIG. 2A: Schematic representation of the device structure. The nanoparticles form a network of resistive switches, resulting in "on" and "off" states for the device, with multiple conduction paths.
Figure 2B:
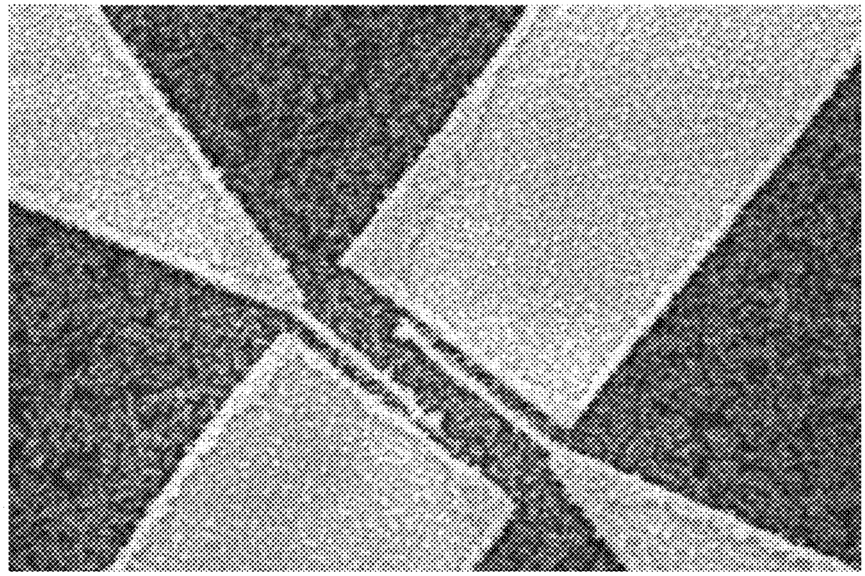
FIG. 2B: The actual device. The bright regions are the Au contacts. The nanoparticles cover the contact region and are not readily visible, but do show up as brighter areas on the contacts.
Figure 2C:
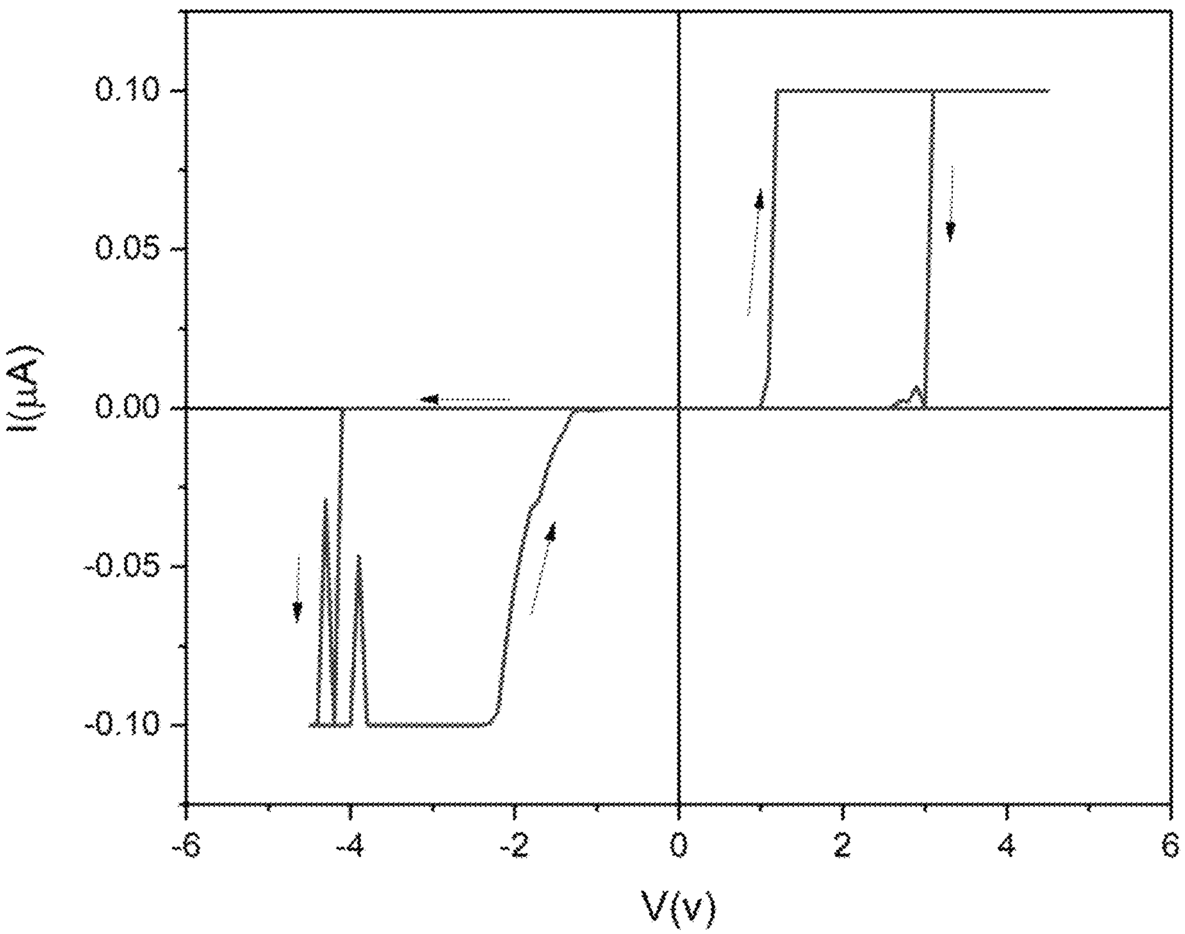
FIG. 2C: The I-V curve of the device showing distinct "on" and "off" states characteristic of resistive switching behavior.

When a network of these nanoparticles is assembled, with the nanoparticles in contact with one another, resistive switching is also observed (FIGS. 2A-2C). With multiple possible paths, and well-defined on and off states, this is a realistic artificial synapse. FIG. 2A shows a schematic representation of the contact configuration and the arrangement of nanoparticles between the contacts. In a network of Co/ZnO resistive switching nanoparticles, there are countless switches and multiple conduction pathways (FIG. 2A), providing a clear advantage over von Neumann architectures for creating artificial synapse. The experimental device is shown in FIG. 2B, and the I-V curve is shown in FIG. 2C. FIG. 2C clearly displays resistive switching behavior, with much more pronounced "on" and "off" states than most systems presented in the literature. With this, one may also produce varying degrees of conductivity between electrodes, as one or multiple paths could be "on." This variable current flow is again emulative of synapse. In comparison to previously reported metallic nanoparticle systems showing resistive switching [6,8], the use of a resistive switching material (ZnO) herein rather than a metal provides a more robust and well-known resistive switching material [1-5], and not working at the critical point of percolation [6] will broaden the processing window. As a result, Co/ZnO nanoparticles disclosed herein are characterized by a combination of a resistive switching material assembled in a neuromorphic network, resulting in a highly realistic synapse for an artificial neural network.

Overall, shown here are resistive switching device based on a network of resistively switching core/shell nanoparticles. Embodiments herein can be useful for influence artificial neural networks, leading to significant advancements in neuromorphic computing. Additional applications are in the fields of data storage (memory devices) and sensors.

Various potentially useful descriptions, background information, terminology, mechanisms, compositions, methods, definitions, and/or other embodiments may also be found in Ahmadi, et al. (September 2020; "Resistive Switching in Individual Co/ZnO Core/Shell Nanoparticles Formed via Inert Gas Condensation and Selective Oxidation"; Zahra Ahmadi, Haidong Lu, Pinaki Mukherjee, Mark Koten, Alexei Gruverman, and Jeffrey E. Shield; Adv. Electron. Mater. 2020, 6, 2000065; doi: 10.1002/aelm.2020000650), which is incorporate herein in its entirety by reference.

References, each of which is incorporated herein by reference in its entirety to the extend not inconsistent herewith, corresponding to above description:

1. G. W. Burr, A. Sebastian, E. Vianello, R. Waser and S. Parkin, "Guest Editorial: Emerging materials in neuromorphic computing," APL Materials 8, 010401 (2020).

2. A. S. Sokolov, Y.-R. Jeon, S. Kim, B. Ku, C. Choi, "Bio-realistic synaptic characteristics in the cone-shaped ZnO memristive device," NPG Asia Mater. 11, 5 (2019).
3. Z. Wang, S. Joshi, S. E. Savel'ev, H. Jiang, R. Midya, P. Lin, M. Hu, N. Ge, J. P. Strachan, Z. Li, Q. Wu, M. Barnell, G. L. Li, H. L. Xin, R. S. Williams, Q. Xia, J. J. Yang, "Memristors with diffusive dynamics as synaptic emulators for neuromorphic computing," *Nat. Mater.* 16, 101 (2017).
4. G. W. Burr, R. M. Shelby, A. Sebastian, S. Kim, S. Kim, S. Sidler, K. Virwani, M. Ishii, P. Narayanan, A. Fumarola, L. L. Sanches, I. Boybat, M. Le Gallo, K. Moon, J. Woo, H. Hwang, Y. Leblebici, "Neuromorphic computing using non-volatile memory," Adv. Phys. 2, 89 (2017).
5. J. M. Cruz-Albrecht, T. Derosier, N. Srinivasa, "A scalable neural chip with synaptic electronics using CMOS integrated memristors," Nanotechnology 234, 384011 (2013).
6. A. Sattar, S. Fostner, S. A. Brown, "Quantized conductance and switching in percolating nanoparticle films," *Phys. Rev. Lett.* 111, 136808 (2013).
7. S. Shirai, S. K. Acharya, S. K. Bose, J. B. Mallinson, E. Galli, M. D. Pike, M. D. Arnold and S. A. Brown, "Long-range temporal correlations in scale-free neuromorphic networks," Network Neuroscience (in press) (2020). doi: 10.1162/netn_a_00128.
8. M. Mirigliano, F. Borghi, A. Podesta, A. Antidormi, L. Colombo and P. Milani, "Non-ohmic behavior and resistive switching of Au cluster-assembled films beyond the percolation threshold," Nanoscale Adv. 1, 3119 (2019).
9. J. B. Mallinson, S. Shirai, S. K. Acharya, S. K. Bose, E. Galli and S. A. Brown, "Avalanches and criticality in self-organized nanoscale networks," Science Advances 5, eaaw8438 (2019).
10. Z. Ahmadi, H. Lu, P. Mukherjee, M. Koten, A. Gruverman and J. E. Shield, "Resistive switching in individual Co/ZnO core/shell nanoparticles formed via inert gas condensation and selective oxidation," Adv. Elec. Mater. (submitted).
11. J. Zhao, F. Liu, J. Sun, H. Huang, Z. Hu, X. Zhang, "Low power consumption bipolar resistive switching characteristics of ZnO-based memory devices," Chin. Opt. Lett. 10, 013102 (2012).
12. G. Chen, C. Song, C. Chen, S. Gao, F. Zeng, F. Pan, "Resistive switching and magnetic modulation in cobalt-doped ZnO," Adv. Mater. 24, 3515 (2012).
13. Y. Fujisaki, "Current Status of Nonvolatile Semiconductor Memory Technology," Jpn. J. Appl. Phys. 49, 100001 (2010).
14. E. J. Fuller, S. T. Keene, A. Melianas, Z. Wang, S. Agarwall, Y. Li, Y. Tuchman, C. D. James, M. J. Marinella, J. J. Yang, A. Salleo and A. A. Talin, "Parallel programming of an ionic floating-gate memory array for scalable neuromorphic computing," Science 364, 570 (2019).

The invention can be further understood by the following non-limiting examples.

Example 1: Resistive Switching in Individual Co/ZnO Core/Shell Nanoparticles Formed Via Inert Gas Condensation and Selective Oxidation Abstract: Magnetron sputtering inert gas condensation was used to produce core/shell Co/ZnO nanoparticles. Selective oxidation to form the core/shell nanoparticles was accomplished both during nanoparticle formation ("in situ") and with exposure to ambient conditions ("ex situ"). The ZnO formed in situ showed single-crystalline nature with specific orientation relationships with the Co core, while the ZnO formed ex situ was polycrystalline. Conductive atomic force microscopy was utilized to measure the electrical behavior of individual nanoparticles, and both types of core/shell nanoparticles displayed classic bipolar resistive switching behavior. These results highlight application of these nanoparticles as promising next generation non-volatile memories and neuromorphic computational devices.

The development of non-volatile memory has long pursued alternative designs and materials for excellent scalability and low energy consumption.[1] In that direction, Resistive Random-Access Memory (RRAM) has attracted considerable attention due to its simple capacitor-like configuration of metal/active layer/metal, low power consumption and high speed.[2] The electric field-induced resistance switching in transition metal oxides is attractive due to simple composition and adjustable stoichiometry of the oxide thin film.[3] Furthermore, resistive switching has been observed in polycrystalline transition metal oxide thin films which eliminates the need for single-crystalline materials and related deposition challenges.[4,5] Although switching mechanisms in different materials are under debate, formation and rupture of filaments (or path) comprising oxygen vacancies or metallic ions within metal oxides are believed to play the dominant role.[6-15] Decreasing the scale of the non-volatile resistive switching memristor is strongly desired, motivating researchers to search for promising high-density memory devices. For example, Schmidt et al. studied the resistive switching behavior of chemically synthesized $TiO_2$ particles after treated thermally under oxidizing or vacuum conditions.[16]

Moreover, nanoscale memristors have been considered as building blocks of neuromorphic computational systems which operate on brain-like principles.[17] However, complex and critical interconnections (synaptic connections) between building blocks are necessary to achieve the highest computational performance.[18] Bose et al. focused on networking nanoscale metal memristors which showed neuromorphic switching behavior near the percolation threshold.[19] Sokolov et al. achieved the synaptic functions within a low-power rectifying diode-like ZnO resistive switching device.[20]

Core/shell nanostructures are gaining more and more attention due to their multifunctional properties,[21-23] as they provide the opportunity to create novel behavior by combining multiple components within one nanoscale object. In addition to multifunctionality of core/shell nanostructures, an appropriate selection of shell material can help to improve dispersibility, reactivity, thermal stability, or oxidative stability of the core material.[24-26] Thus, various methods have been developed for synthesizing core/shell nanostructures offering different core size, shell thickness, morphology, shape and compositions. These methods generally fall into two categories: liquid-based techniques (e.g., colloidal aggregation,[27] sol-gel,[28] or electrochemical deposition),[29] and gas phase aggregation processes (e.g., chemical vapor deposition,[30] inert gas condensation,[31] or laser printing)[32]. The gas phase aggregation method is attracting interest due to its ability to work in high or ultrahigh vacuum environments, which facilitates the chemical purity of the nanoparticles and is compatible with device fabrication via conventional lithographic techniques. All gas phase aggregation techniques are based on nucleation and growth of nanoparticles from the saturated vapor phase of elements, with many techniques for producing the vapor phase such as arc discharge,[33,34] pulsed microplasma,[35,36] laser vaporization,[37,38] Joule heating,[39,40] or sputtering.[41,42]

Core/shell nanoparticles using physical techniques have been formed via several different processes. Y. Huttel et al. utilized multiple magnetron sputtering sources to fabricate core/shell Ag/Au and Co/Au nanoparticles.[43,44] Here, creating core/shell nanoparticles depends on the position of the individual magnetron gun from the aggregation zone, as the individual sputtering guns are offset. A nanoparticle is nucleated from the first plasma source. This nanoparticle then flows through the second source's vapor, and the second species forms on the first nanoparticle. The shell either nucleates on the surface or forms as a cluster itself, and then creates a core/shell structure after coalescence with the first nanoparticle.[45,46] The advantage of this is that either species can form the core or shell, and the thickness is controlled by controlling the offset and sputtering conditions. In single-gun systems, the possibility of two distinct nucleation zones may also lead to core/shell formation.[47,48] Core/shell nanoparticles can also form via kinetic trapping or via self-segregation during or after condensation of multi-element nanoparticles. Here, the element with lower surface energy segregates to the surface, forming the shell.[31,49] The formation of core/shell nanoparticles has been observed to be size-dependent, as smaller particles made with immiscible elements form non-equilibrium solid solutions.[50]

Herein, another technique is described by which core/shell nanoparticles can be fabricated, according to embodiments: preferential oxidation. The preferential oxidation of the more reactive species can be accomplished both in situ and ex situ, resulting in metal oxide shells on metal cores, with stark differences in the shell structure depending on whether it is formed in- or ex situ. Accordingly, embodiments herein include a new design of memory cell with resistive switching in single core/shell nanoparticles of in situ and ex situ Co/ZnO. In principle, these core/shell nanoparticles follow the configuration of conventional thin film systems, i.e., metal-insulator-metal, although here it is metal-insulator-metal-insulator-metal. The devices made by these nanoclusters, for example, showed bipolar resistive switching without needing the electroforming process, and required minimal power to activate the switching processes. Electroforming, which is a necessary process in many resistive switching devices,[51] is a high-voltage nondestructive breakdown which activates the device for resistive switching behavior by generating vacancies or conductive paths. The avoidance of electroforming here is significant, as it is beneficial in realization of high-density resistive random access memory applications.[52]

Exemplary, Non-Limiting, Experimental Procedures

Figure 3:
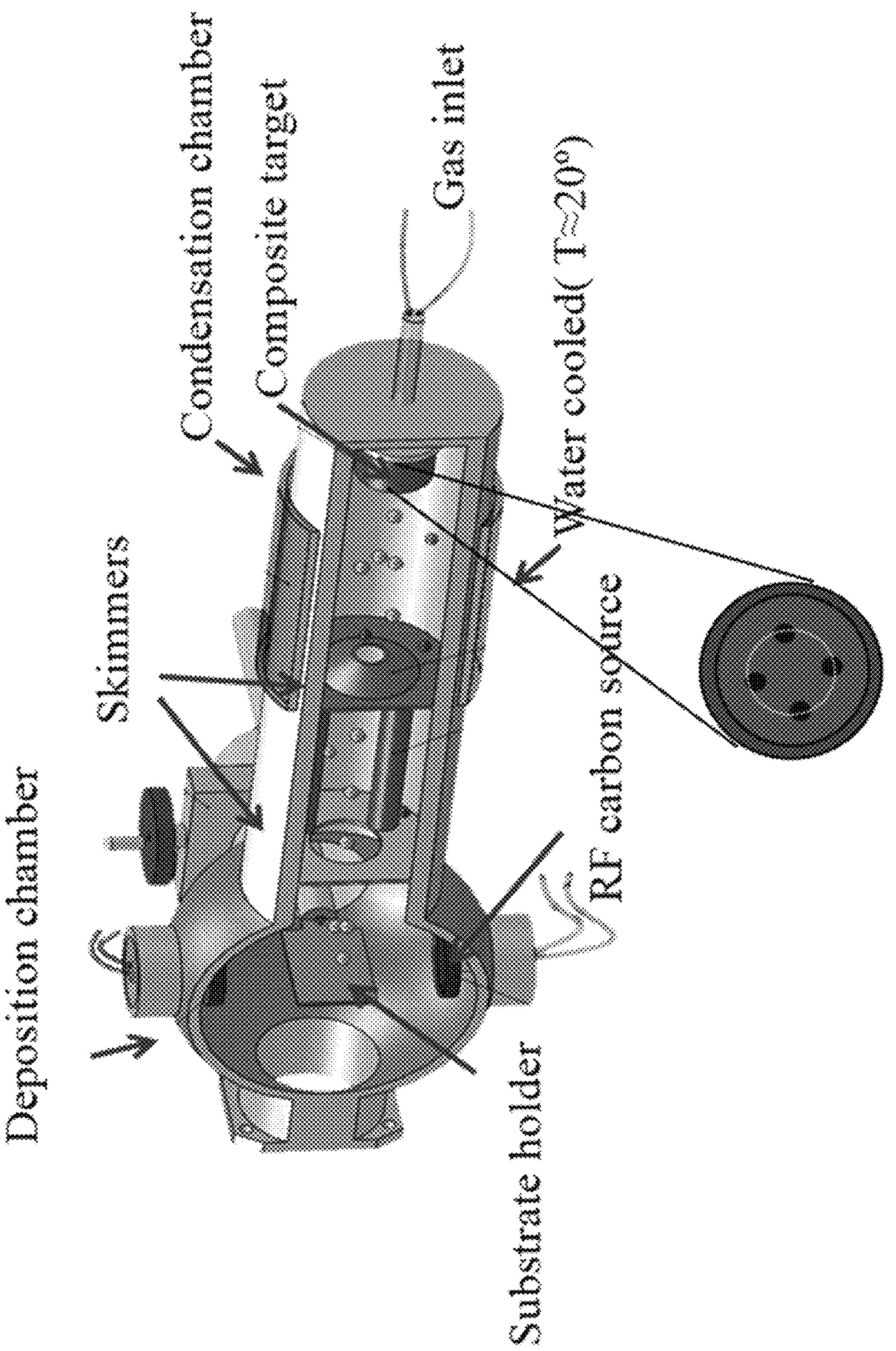
FIG. 3: Schematic rendering of the inert gas condensation chamber.

Nanoclusters were created using inert gas condensation (IGC), shown schematically in FIG. 3.[53] The IGC system is made up of two chambers, the condensation chamber and deposition chamber, which are separated by two apertures, one 7.0 mm and the other 2.5 mm in diameter. The 2.5 mm aperture separates the condensation chamber from the rest of the system. No mass selection device or aerodynamic lens was used between the two chambers. A DC sputtering gun (3 in. Stiletto series, AJA International) was mounted in the condensation chamber. The power of the DC gun was set to 100 W with the discharge current about 350 mA. The base pressure of the chamber before initiation of gas flow was about $2\times10^{-6}$ mbar. The flow of Ar was about 90 sccm. A composite Co disk (Kurt J. Lesker Company) 0.25 in. thick by 3 in. in dimeter with Zn rods embedded around the "racetrack" was used as the target to fabricate Co/Zn and Co/ZnO nanoclusters. Nanoclusters were deposited directly on 3 mm TEM copper grids mounted on a sample holder in the deposition chamber. An RF sputtering gun was mounted normal to the nanoparticle flight axis in the deposition chamber for depositing carbon film as a protective layer on some samples to study as-deposited nanoclusters not exposed to atmosphere. A FEI Tecnai Osiris TEM and FEI Titan Themis aberration-corrected scanning transmission electron microscope (S-TEM) operated at 200 kV were used for TEM and STEM imaging and energy dispersive X-ray spectroscopy (EDS) elemental mapping. The analysis of TEM and STEM data was performed using ImageJ, PTCLab, DigitalMicrograph and Velox software. The size distribution of nanoclusters was quantified by ImageJ by sampling about 800 particles from low magnification TEM images. I-V characteristics were measured by placing the conductive atomic force microscopy (AFM) tip on top of the nanoparticles to study the resistive switching behavior of nanoclusters. For this, nanoclusters forming closer to the DC gun were harvested, where 50 nm and larger clusters were created. Nanoclusters were deposited on naturally oxidized Si wafer with a 60 nm Au thin film on top as the bottom electrode.

Results and Discussion

Figure 4A:
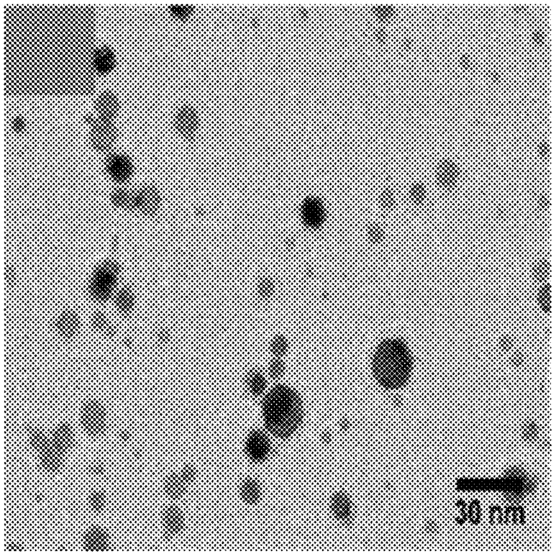
FIGS. 4A-4F: As-deposited Co/Zn nanocluster covered with 10 nm carbon.
Figure 4B:
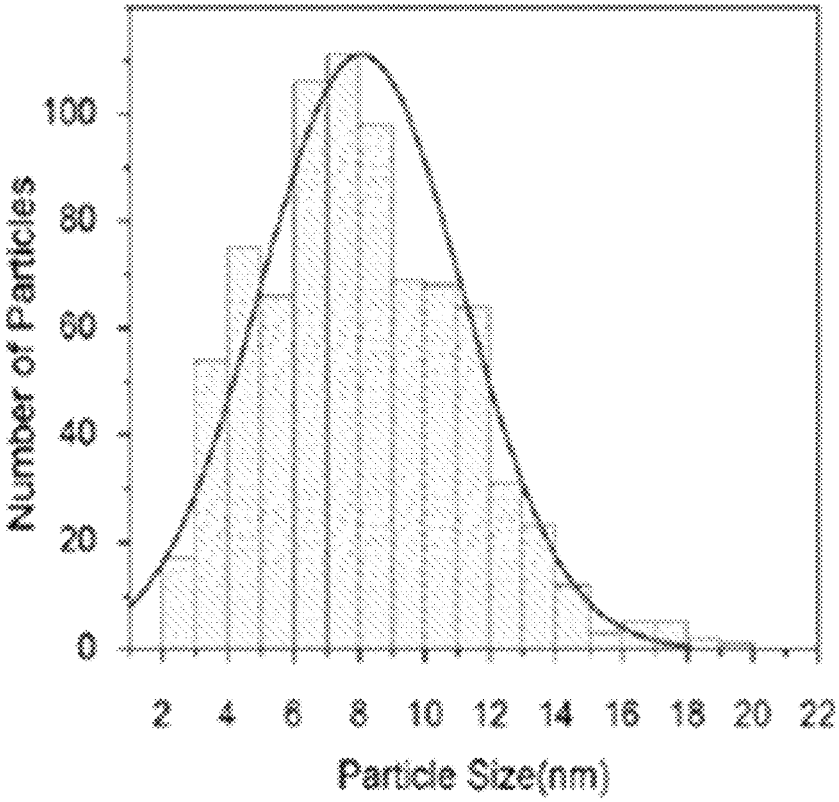
Figure 4C:
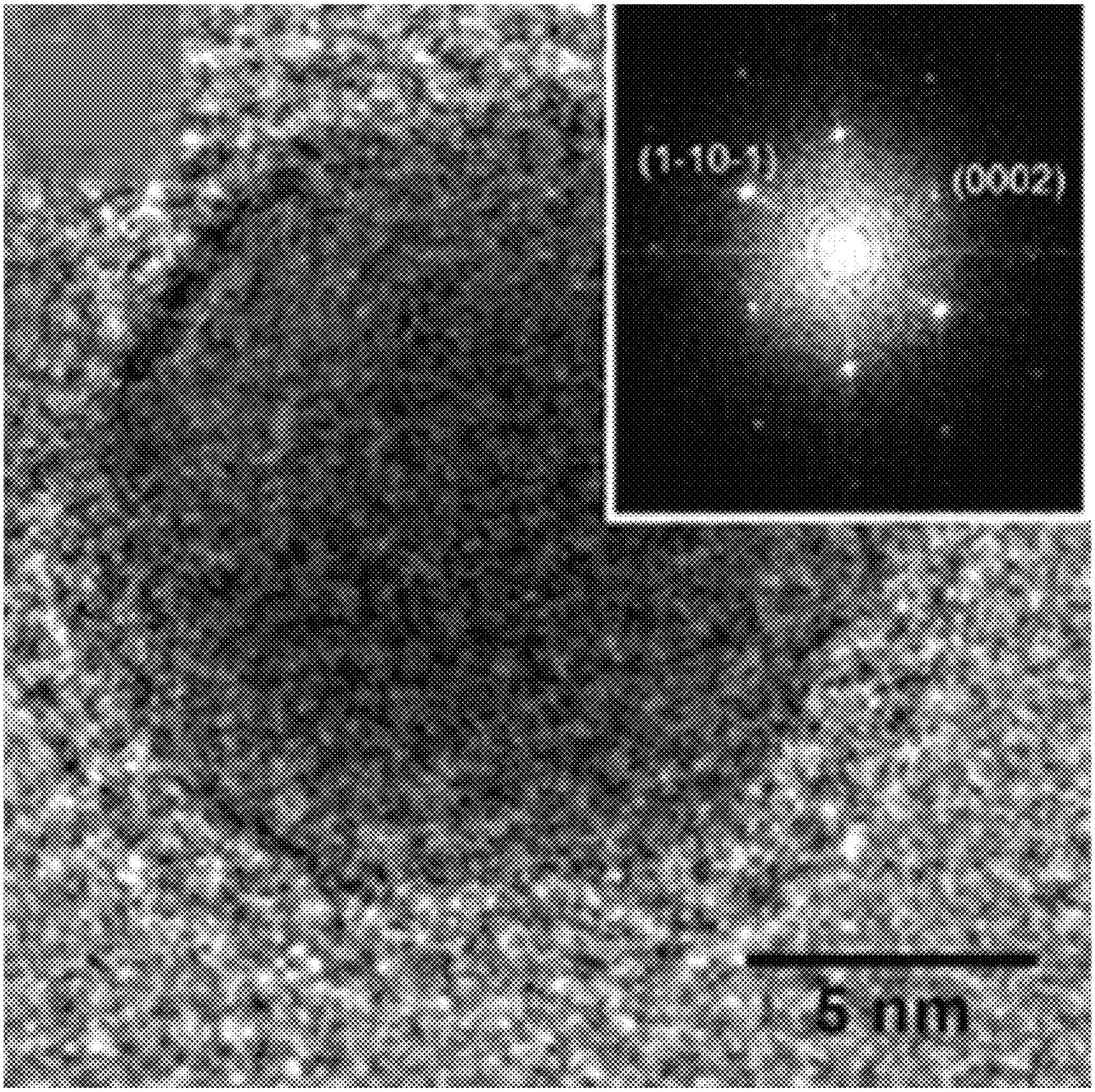

FIG. 4A shows the low-magnification TEM image of as-deposited Co/Zn covered with about 10 nm of carbon to avoid oxidation. The size distribution was fitted by a Gaussian function, resulting in an average size of 8.1±3.1 nm. The ratio of standard deviation to average size (σ/d) was about 0.38 for Co-Zn which indicates a relatively broad distribution, consistent with gas aggregation processes without mass selection. The high-resolution image in FIG. 4C revealed that the as-deposited nanoclusters were single crystalline, as the lattice fringes extend across the diameter of the clusters. This single-crystalline nature is confirmed by the fast Fourier transform (FFT) shown in the inset. The FFT was indexed to the $[11\bar{2}0]$ zone axis of hcp Co with lattice parameters a=2.55 Å and c=4.12 Å. Less than 20% of nanoparticles were observed to form in an fcc structure, and the rest were hcp.

Figure 4D:
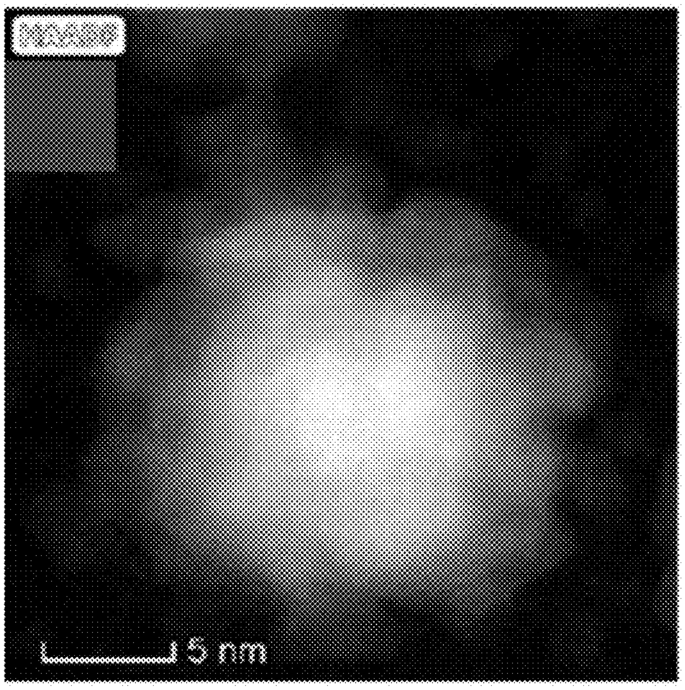
Figure 4E:
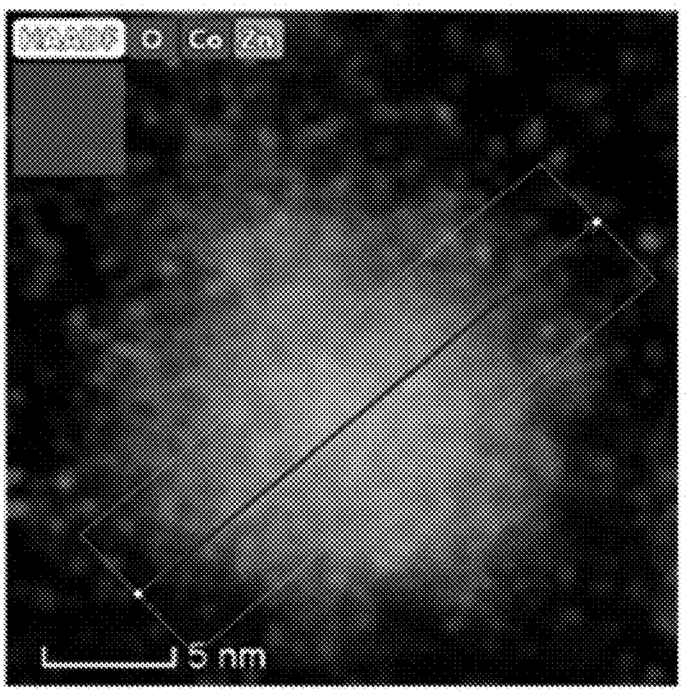
Figure 4F:
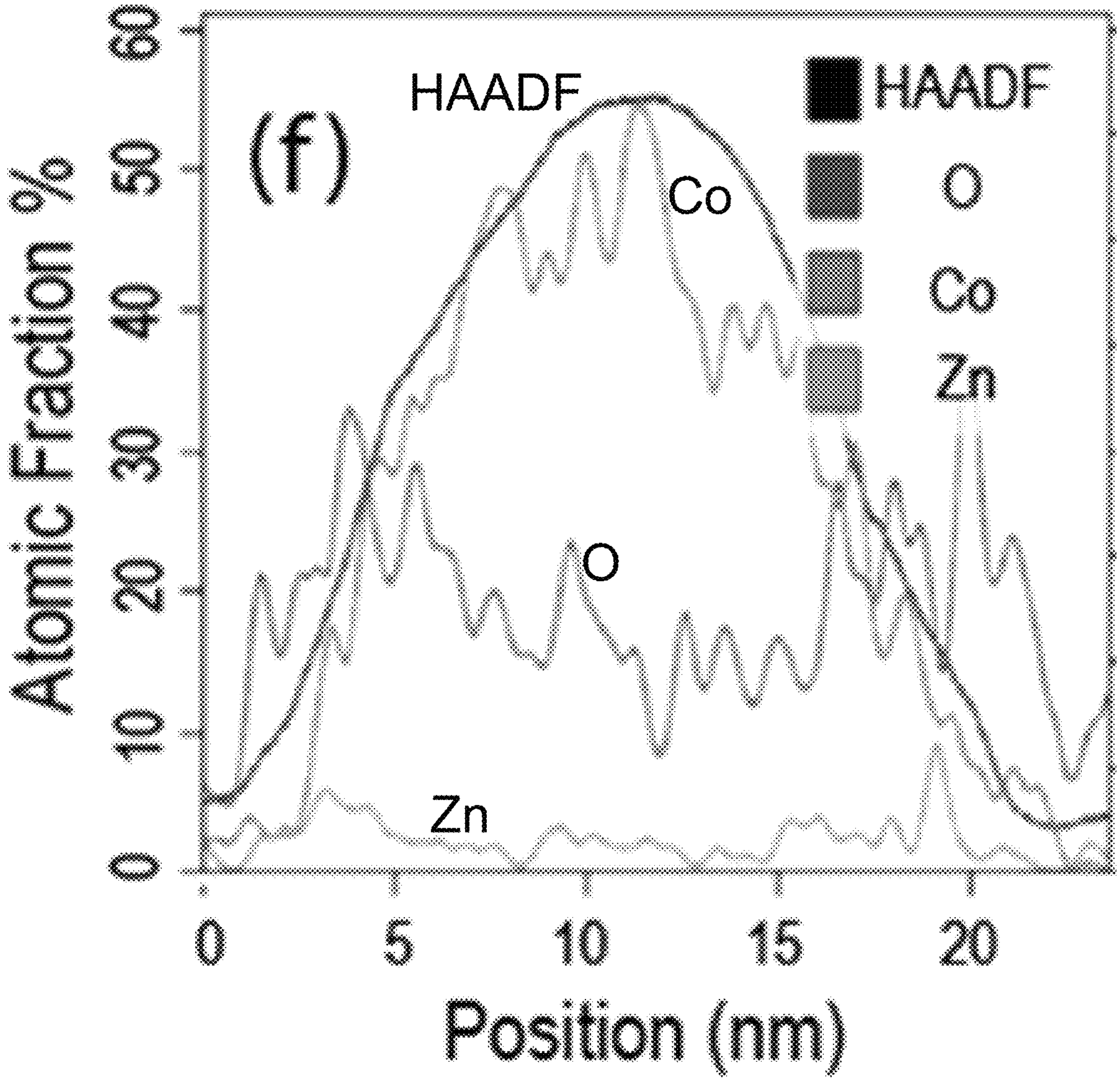

The elemental map from EDS analysis (FIG. 4E) and compositional line scan (FIG. 4F) of the particle in FIG. 4D showed a compositional variation consistent with a core shell structure with a core of Co with a Zn shell. If the core/shell formation was driven by surface energy considerations, this is the configuration expected, considering that Zn has a lower surface energy than Co.[54] However, other mechanisms are possible as well, such as kinetic trapping [P. Mukherjee, B. Balamurugan, J. E. Shield and D. J. Sellmyer, "Direct gas-phase formation of complex core-shell and three-layer Mn-Bi nanoparticles," RSC Advances 6, 92765-92770 (2016); M. F. Hagan, O. M. Elrad and R. L. Jack, "Mechanisms of kinetic trapping in self-assembly and phase transformation," J. Chem. Phys. 135, 104115 (2011); P. Grammatikopoulos, J. Kioseoglou, A. Galea, J. Vernieres, M. Benelmekki, R. E. Diaz and M. Sowwan, "Kinetic trapping through coalescence and the formation of patterned Ag—Cu nanoparticles," Nanoscale 8, 9780 (2016).]. In other work, systems showed that core/shell formation was a function of size, with smaller nanoparticles forming non-equilibrium solid solutions[56,57].

Figure 5A:
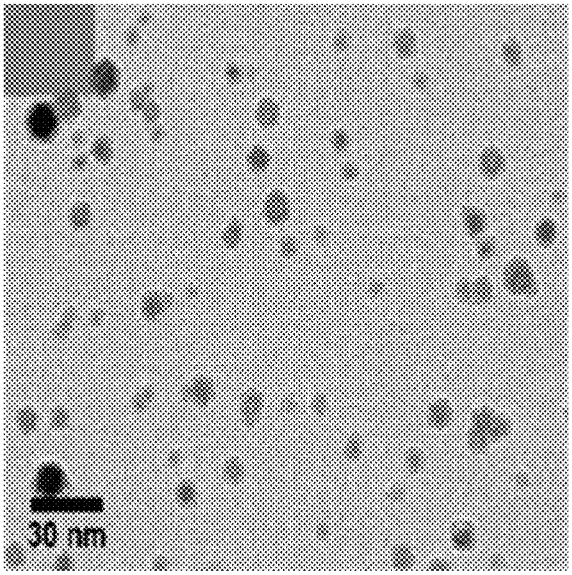
FIGS. 5A-5F: ex situ-formed Co/ZnO nanoclusters.
Figure 5B:
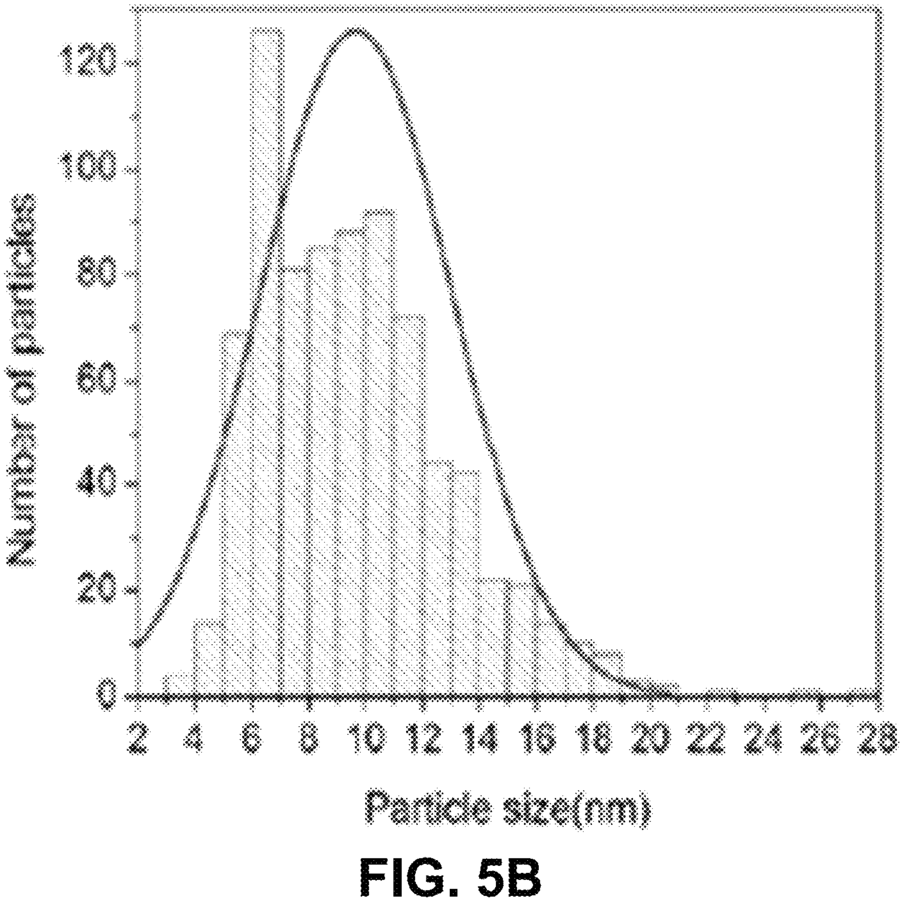
Figure 5C:
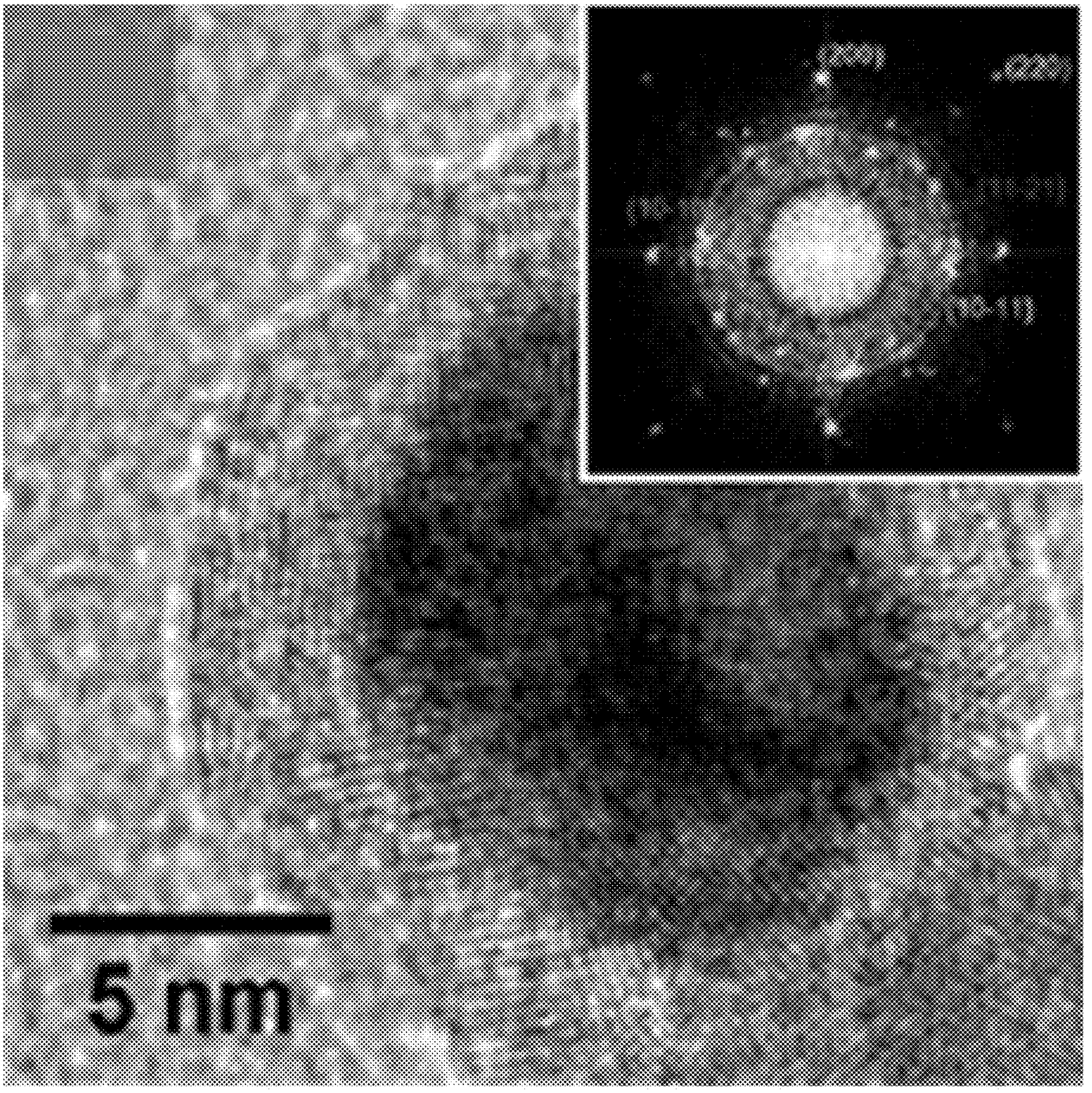
Figure 5D:
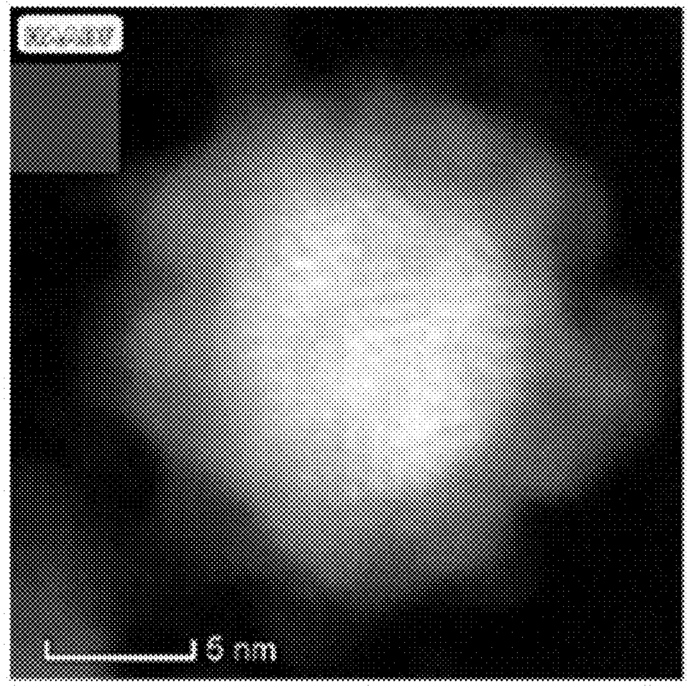
Figure 5E:
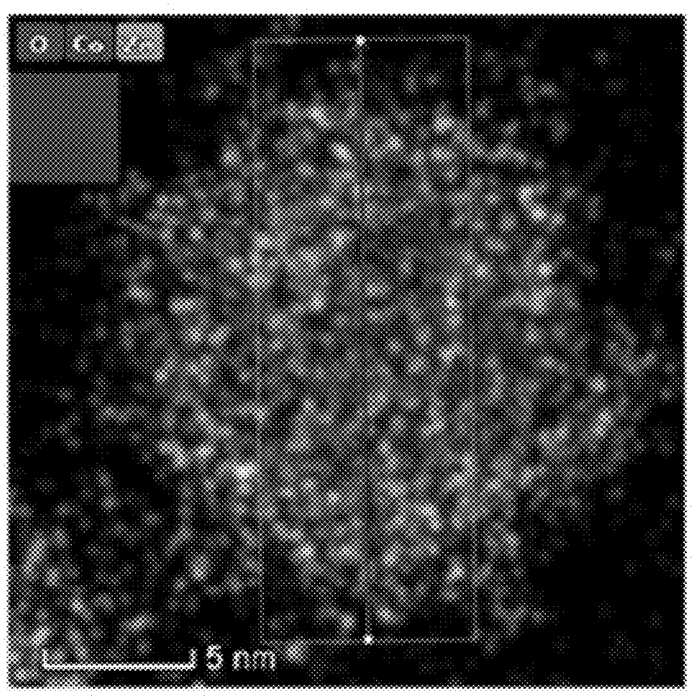
Figure 5F:
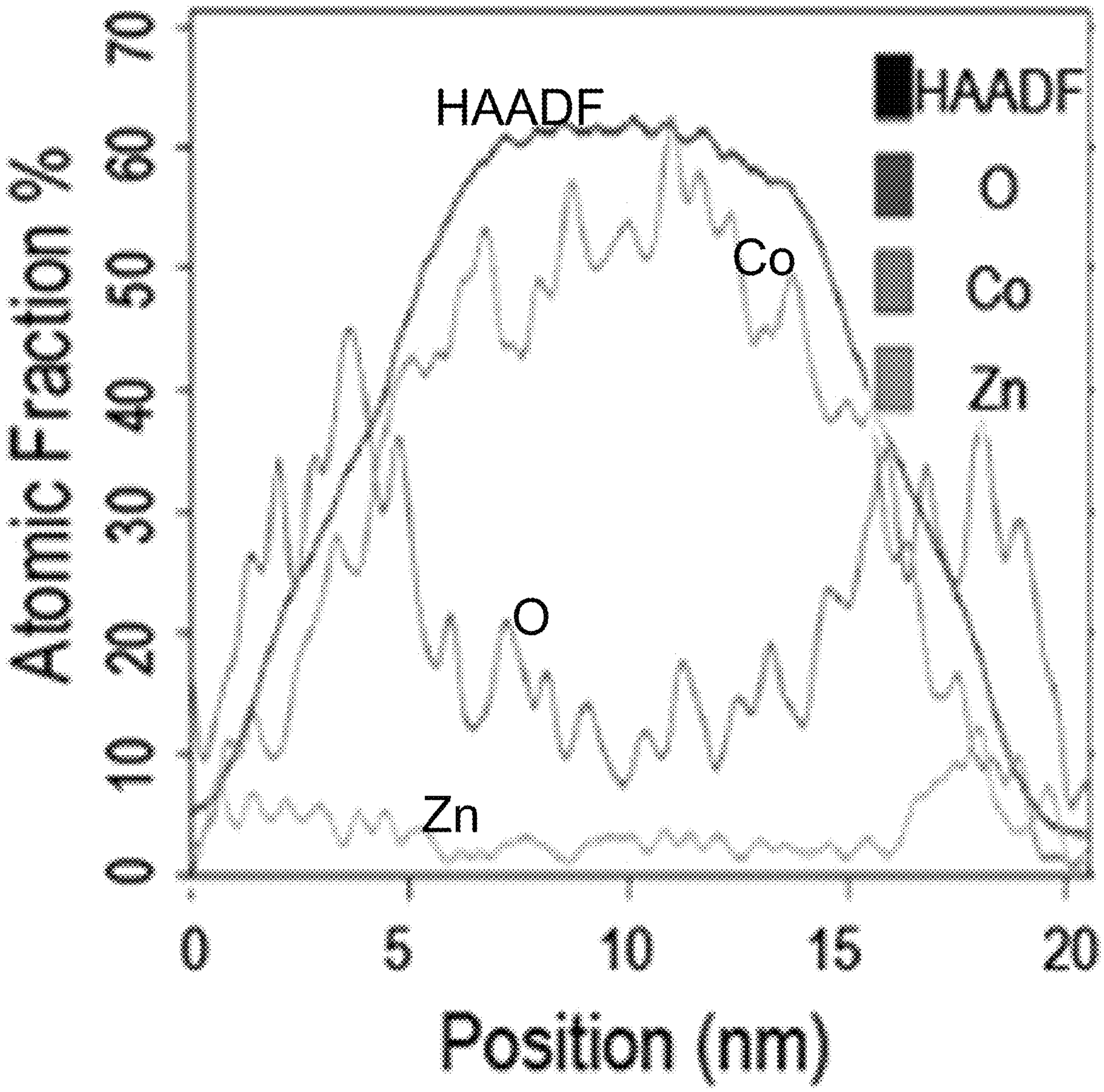

To form an oxide layer, nanoclusters deposited onto graphite support films were not coated by the protective carbon layer. Thus, the nanoclusters were exposed to ambient atmospheric conditions once removed from the deposition chamber (what referred to herein as "ex situ oxidation"). The average size of the nanoparticles was 9.6±3.3 nm, with σ/d~0.35, indicating that the size of the nanoclusters increased slightly after oxidation. Exposing the as-deposited Co/Zn nanoclusters to atmosphere resulted in the formation of strongly core/shell nanoparticles, with ZnO forming the shell and Co the core. The HRTEM image (FIG. 5C) showed that the core was single crystalline, as manifested by the lattice planes extending across the entirety of the core region. In this case, the FFT of this nanocluster was indexed to fcc Co with zone axis of [001]. However, other nanoclusters were also indexed to the hcp Co structure—indicative of the closeness in energy of the two structures. The ZnO shell region shown in FIG. 5C is clearly polycrystalline, and the multiple reflections formed partial rings corresponding to the $\{10\bar{1}0\}$, $\{10\bar{1}1\}$ and $\{11\bar{2}1\}$ planes of ZnO. The STEM image of the particle in FIG. 5D shows different contrast of the core and shell. The composition map and corresponding line scans clearly show a core/shell structure, with elevated Zn and O content in the shell (FIGS. 5E and 5F). The polycrystalline nature of the ZnO shell is indicative of multiple nucleation sites around the original surface of the Co/Zn nanocluster.

Figure 6A:
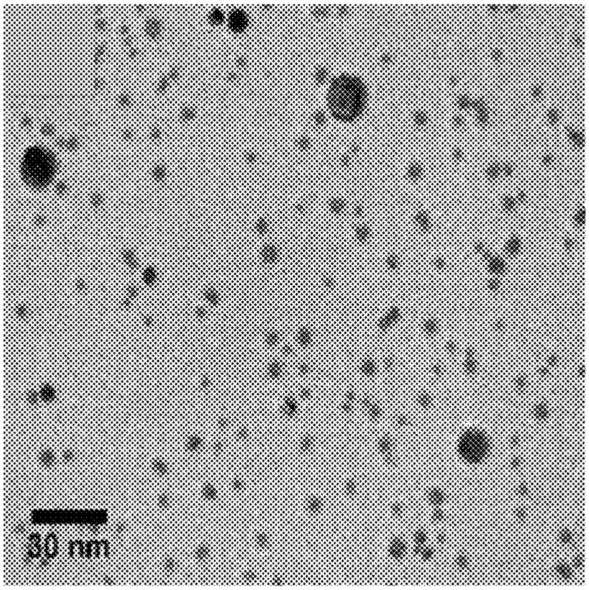
FIGS. 6A-6F: in situ-formed Co/ZnO nanoparticles.
Figure 6B:
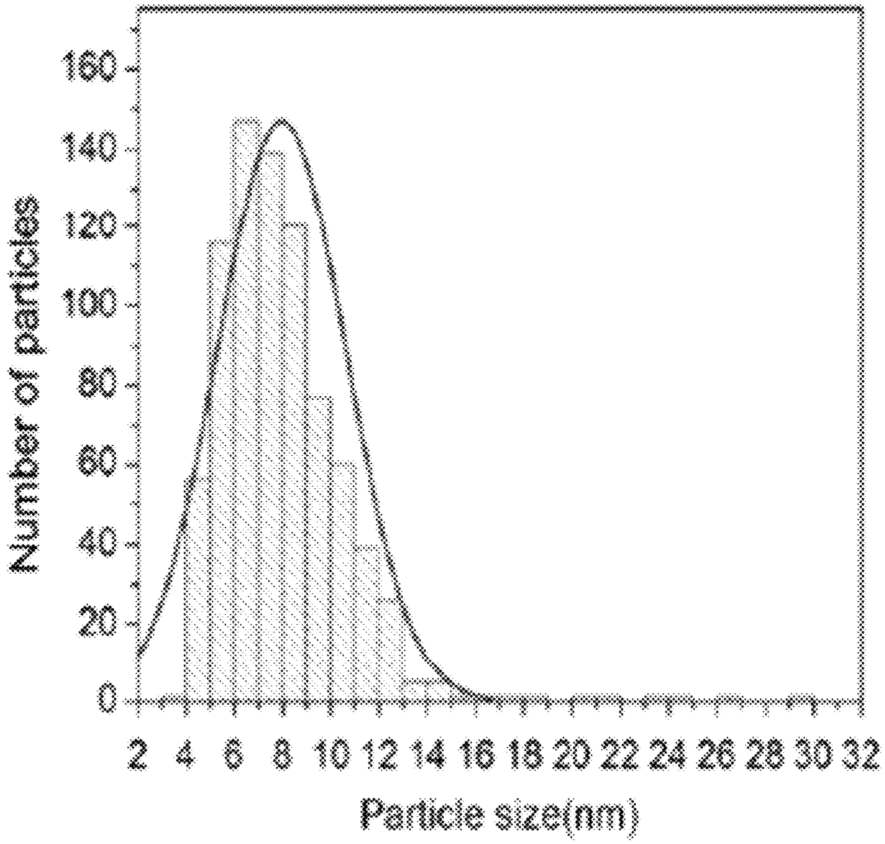
Figure 6C:
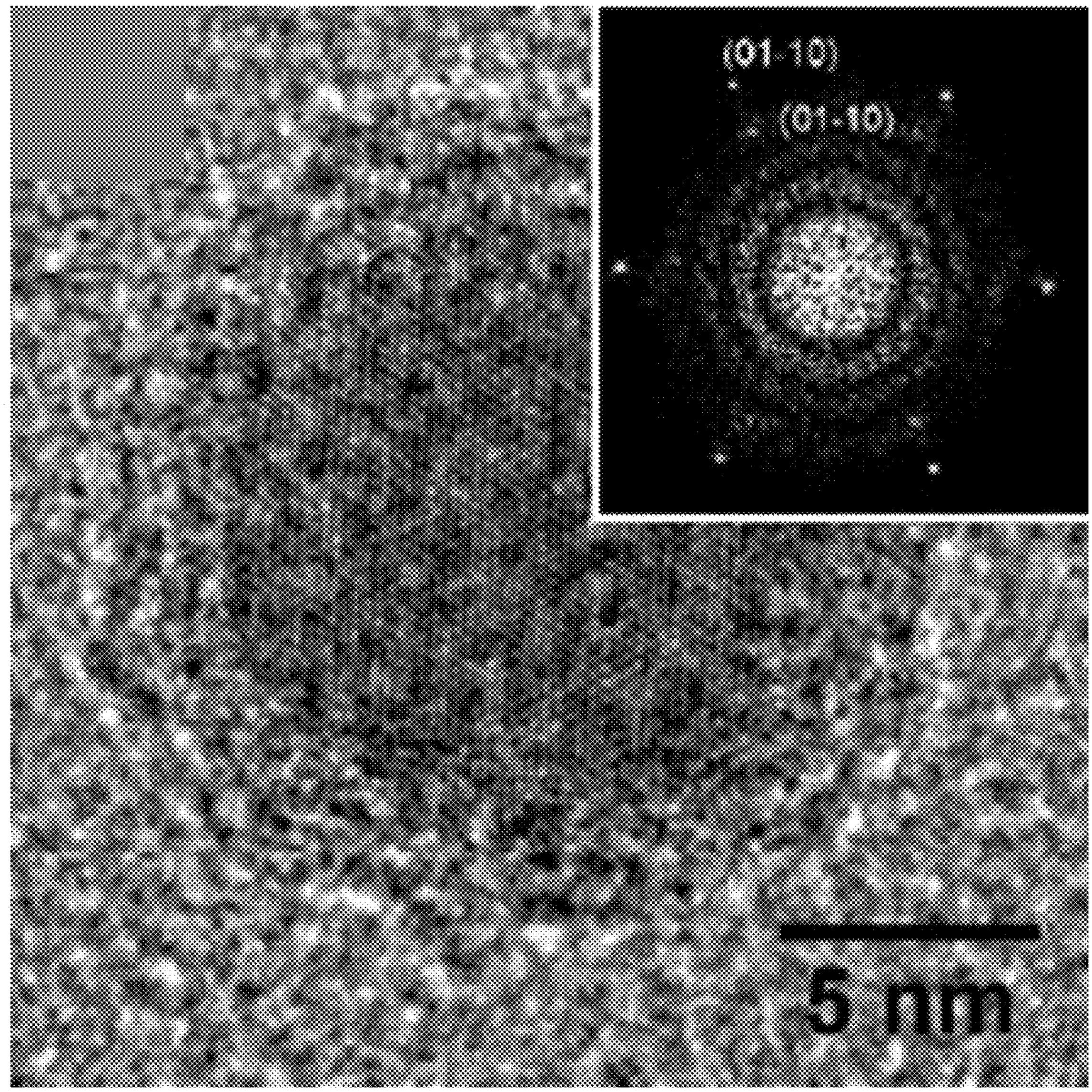
Figure 6D:
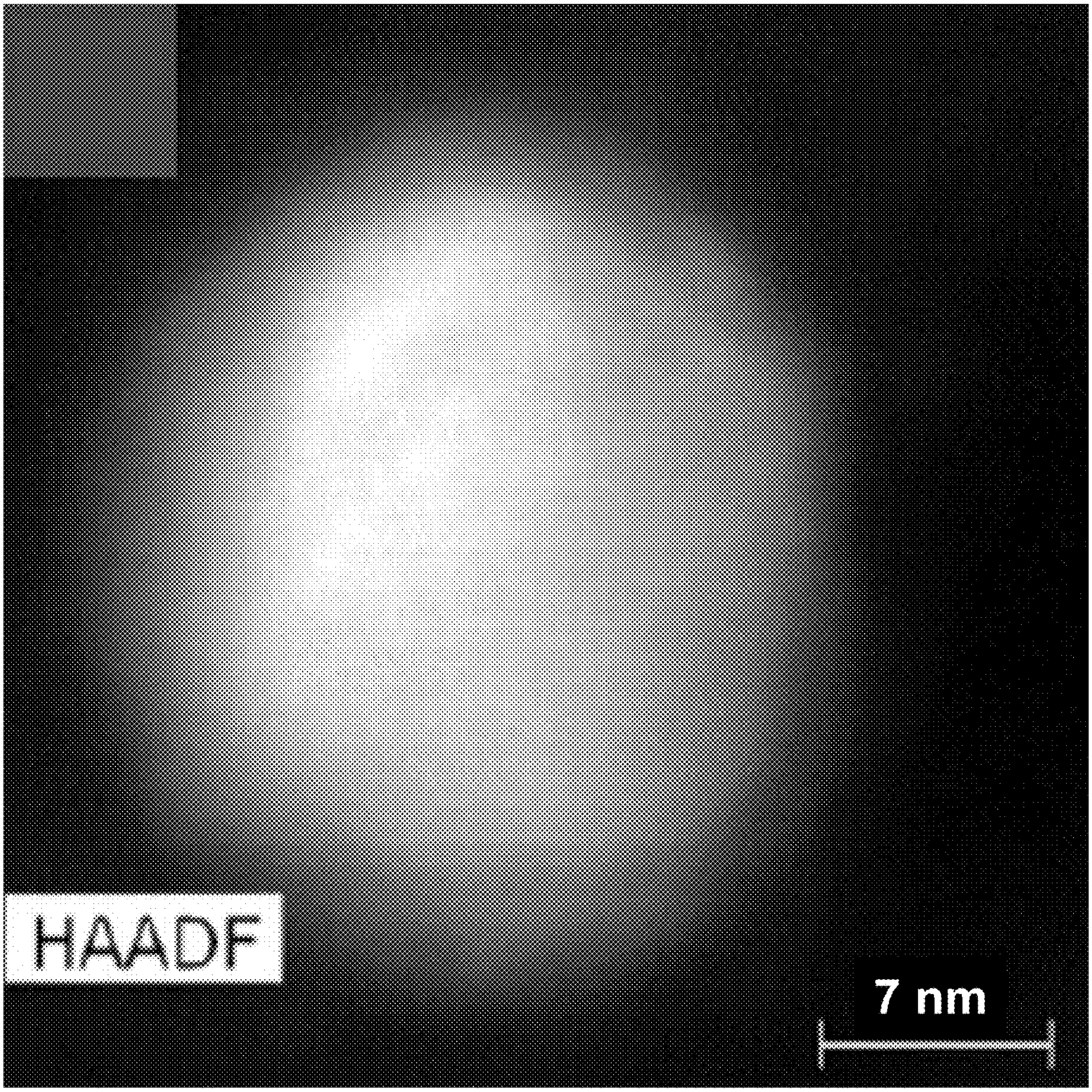
Figure 6E:
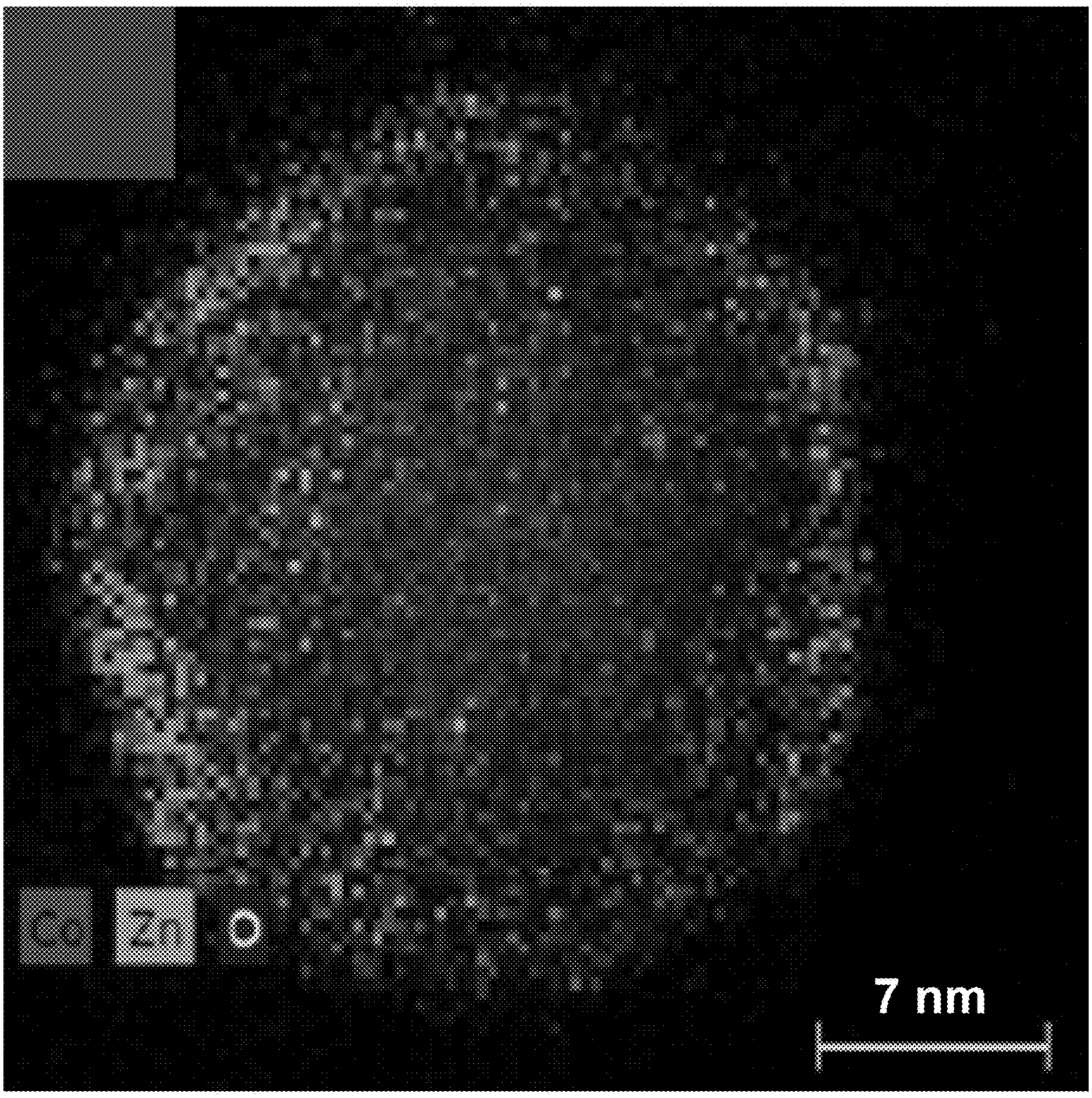
Figure 6F:
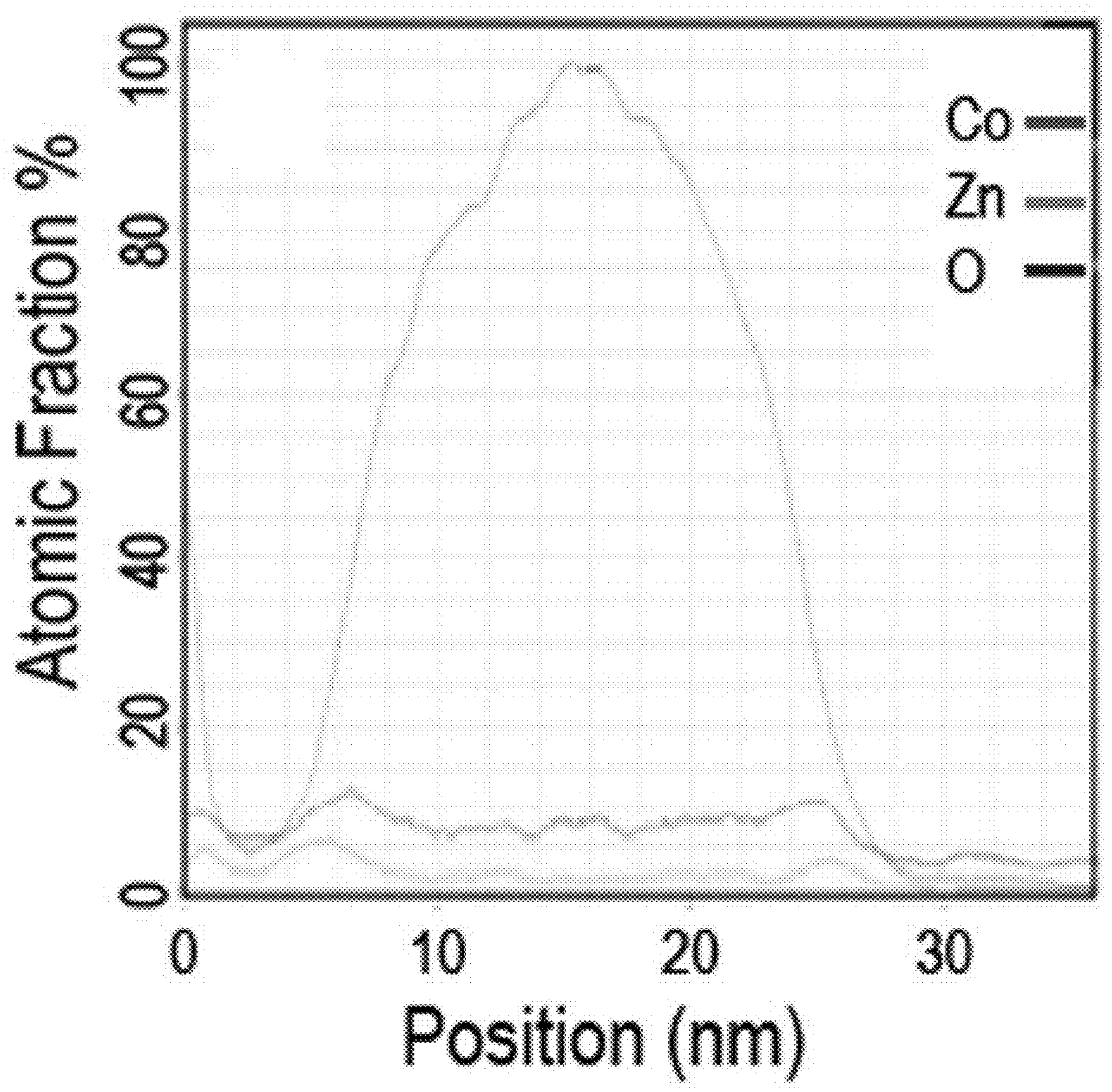

Co/ZnO core/shell structures were also formed by controllably introducing air into the nucleation chamber (referred to herein as "in situ oxidation"). The base pressure after introduction of the flowing air reached $2\times10^{-5}$ mbar. The average size of nanoparticles was 8.0±2.6 nm with o/d of 0.33 (FIG. 6B). The HRTEM images (FIG. 6C) showed that the nanoclusters are single-crystalline, with lattice fringes extending across the diameter of the nanocluster. Interestingly, the FFT reveals the superpositioning of two sets of patterns with a distinct orientation relationship. The two patterns were indexed to hcp Co and hcp ZnO. The FFT was indexed to the [0001] zone axis, with ZnO responsible for inner reflections due to the larger a lattice parameter (3.23 Å), and Co for the outer reflections since the a lattice parameter is smaller (2.55 Å). As opposed to the ex situ-formed ZnO that was polycrystalline, the ZnO here is single-crystalline with an orientation relationship with Co. The elemental map and corresponding line scans of the particle in FIG. 6D clearly showed the distinctive core/shell structure, with ZnO as the shell and Co the core (FIGS. 6E and 6F).

Further investigation of in situ nanoparticles showed that single sets of lattice planes extended across the entirety of the nanoparticles, suggesting at least some epitaxy between the Co and ZnO (FIGS. 7A-7D). FFT of HRTEM image of nanocluster in FIG. 5A indexed to hcp Co with zone axis [$\bar{2}113$] and hcp ZnO with zone axis [0001]. The lattice mismatch of pure hcp Co and ZnO is about 55%, which usually is too large of mismatch to grow epitaxially. Indeed, careful examination of the interface revealed regularly spaced dislocations, suggesting that the interface is semi-coherent. Thus, the strain due to lattice mismatch of Co and ZnO phases is not accommodated by the lattice, and misfit dislocations occurred at the interface between these two phases. The distance between dislocation in semicoherent interfaces is given by[58]

$$D = \frac{b}{\delta} \tag{1}$$

where b is the Burgers vector of dislocations and δ is the lattice mismatch of the two phases, Co and ZnO. Here the magnitude of the Burgers vector is 2.55 Å, and δ is 0.5. Thus, dislocations occur 5 Å apart, or every two continuous planes in the Co phase, to accommodate the mismatch of the lattices. This result is in agreement with the spacing of dislocations at the interface, shown in FIG. 7B, which is a processed image of the region within the box in FIG. 7A. To obtain FIG. 7B, the FFT of the region of interest was formed, followed by filtering which excludes background signals by Fourier mask filtering. Finally, the filtered FFT was transformed to a real space image by using inverse FFT (IFFT).[59] This image shows one dislocation after every two $(0\bar{1}10)$ planes of Co.

Figure 7A:
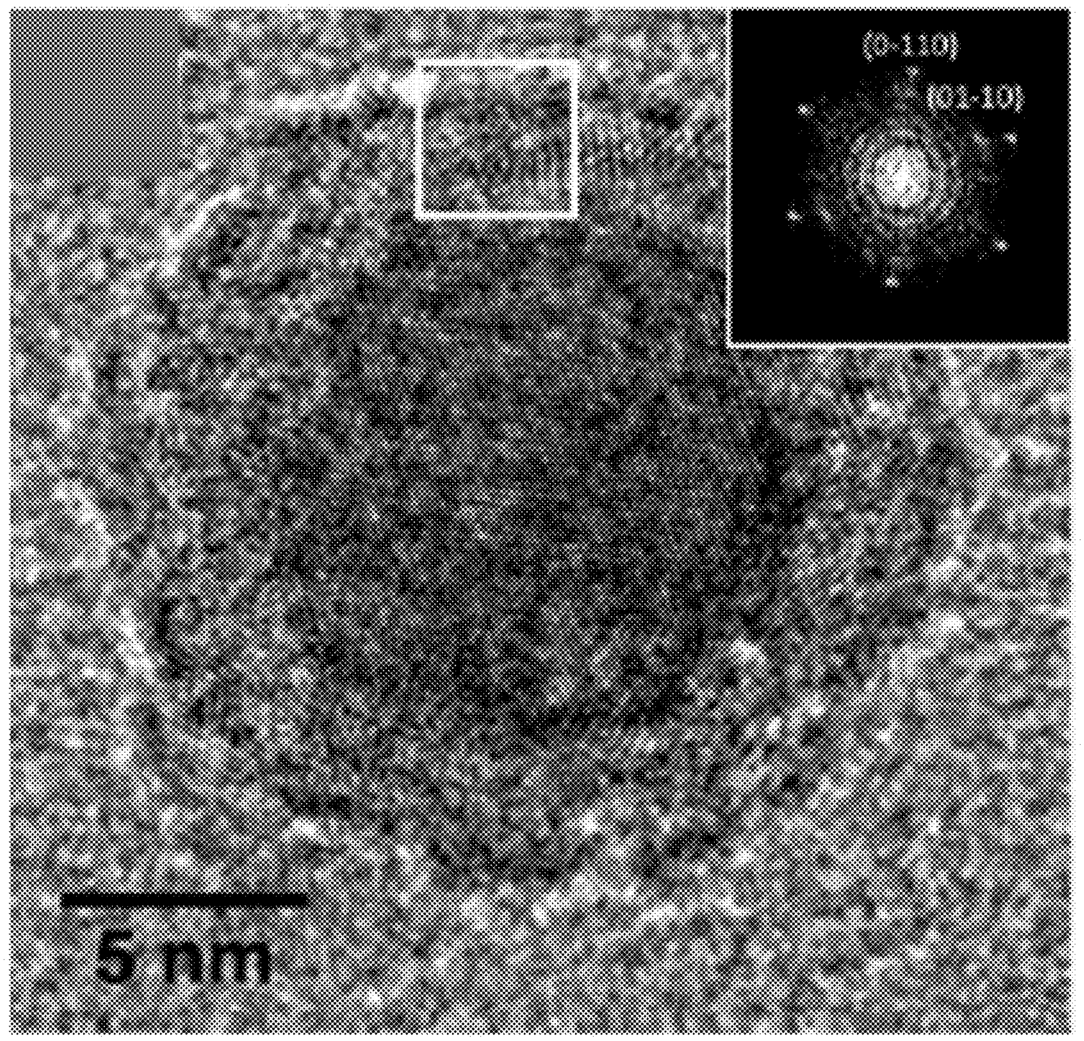
FIG. 7A: hcp Co with zone axis [$\bar{2}$113] and hcp ZnO with zone axis [0001] and indexed planes.
Figure 7B:
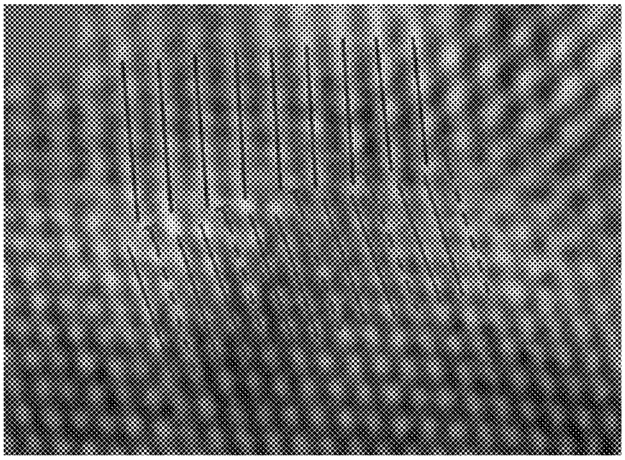
FIG. 7B: Inverse FFT image; dislocations at the interface are shown with dashed red line.
Figure 7C:
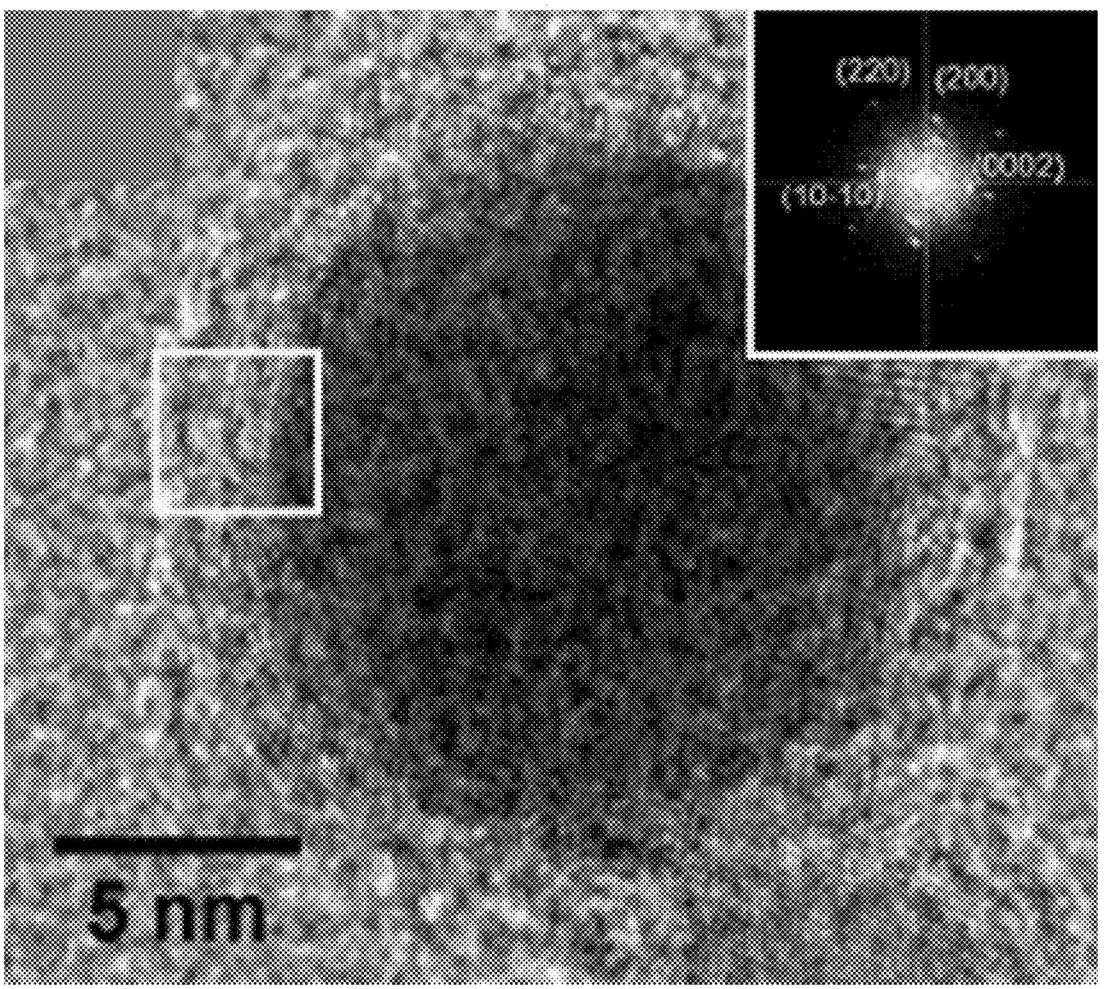
FIG. 7C: fcc Co with zone axis and hcp ZnO with zone axis [$\bar{1}2\bar{1}0$] and indexed planes.
Figure 7D:
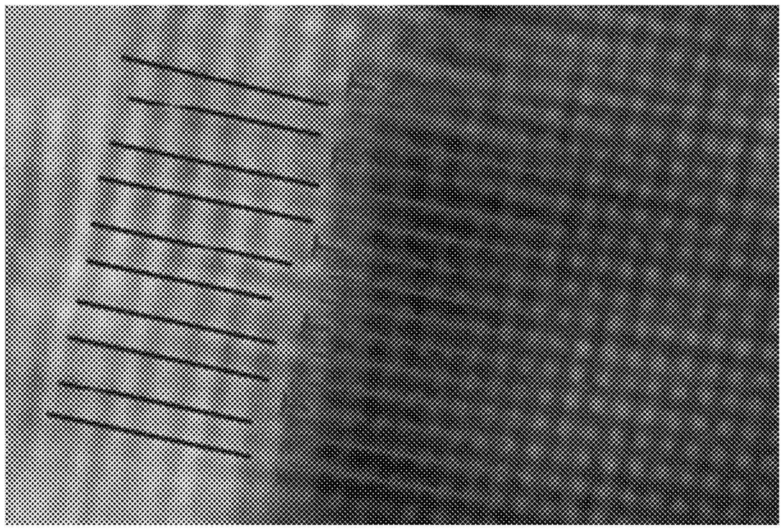
FIG. 7D: Inverse FFT image; dislocations at the interface are shown with dashed red line.

Interestingly, the single crystallinity of ZnO, and epitaxy, is preserved when the core is fcc Co. FIG. 7C shows a nanocluster where the FFT indexes to the fcc structure of Co along the [001] zone axis, and hcp ZnO along the $[\bar{1}2\bar{1}0]$ zone axis. Here, the lattice mismatch and burgers vector are about 44% and 2.50 Å, respectively which resulted in dislocations spacing of about 5.6 Å using Equation (1). Analyzing HRTEM image showed dislocations occur 5.2 Å apart, or every two {200} planes of Co (FIG. 7D), which is slightly smaller than the result of theory. These results showed that in the presence of oxygen during nucleation and growth of the nanoparticles, the formation of single-crystalline ZnO partially epitaxial with the core Co is possible. This is an interesting contrast to the ex situ formation of Co/ZnO core/shell structures described above, and could have interesting ramifications on electronic and magnetic behavior.

The electrical behavior of individual core/shell nanoparticles was measured on larger nanoparticles with diameters above 30 nm collected from the deposition chamber, as it is desirable to have the nanoparticle diameter closer to the AFM tip diameter.

Figure 8A:
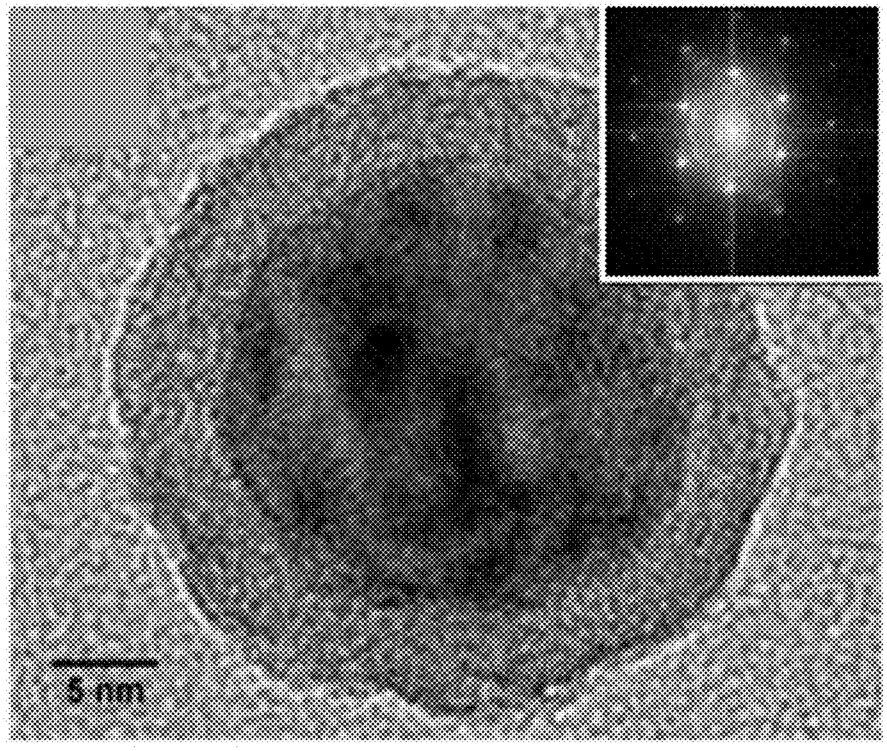
FIG. 8A: 30 nm ex situ Co/ZnO nanoparticles with about 4 nm thick shell.
Figure 8B:
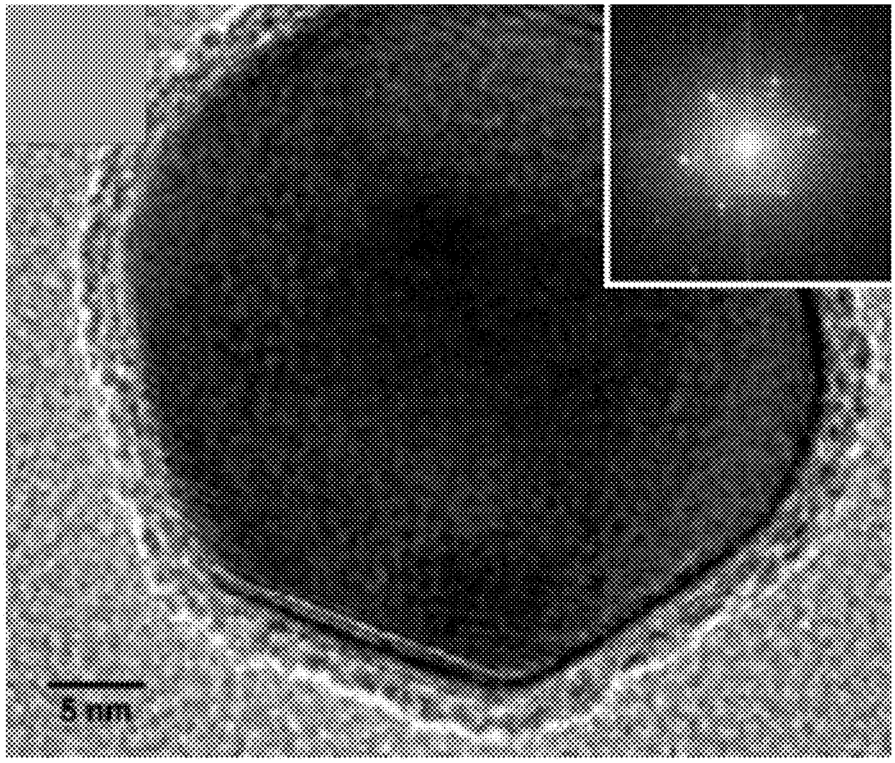
FIG. 8B: 50 nm in situ Co/ZnO with shell thickness about 3 nm. Insets show the FFT of the respective image. AFM topographic images of the nanoparticles on Si/SiO2/Au substrate formed by (FIG. 8C) ex situ oxidation, and (FIG. 8D) in situ oxidation. The inset images show higher resolution single nanoparticles.
Figure 8C:
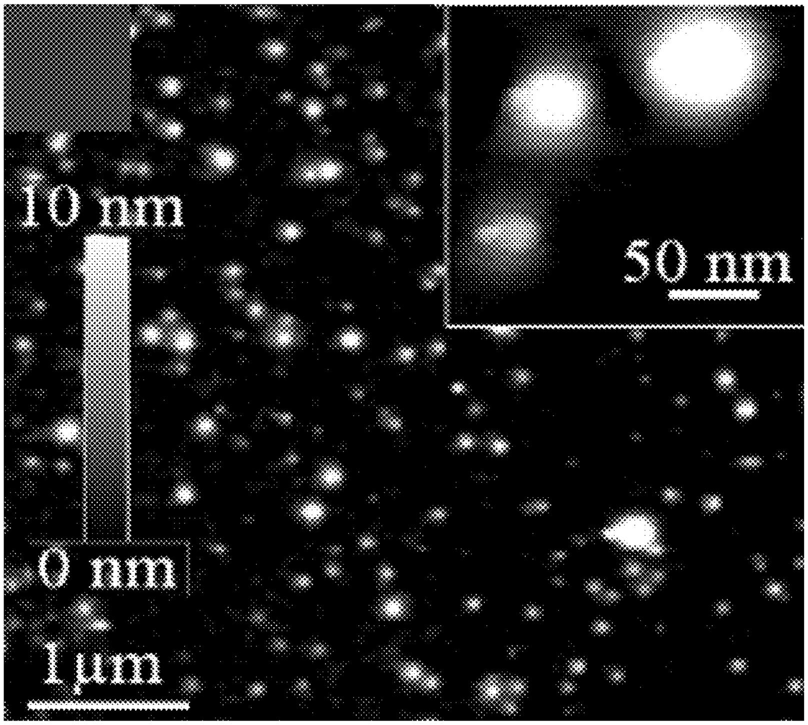
Figure 8D:
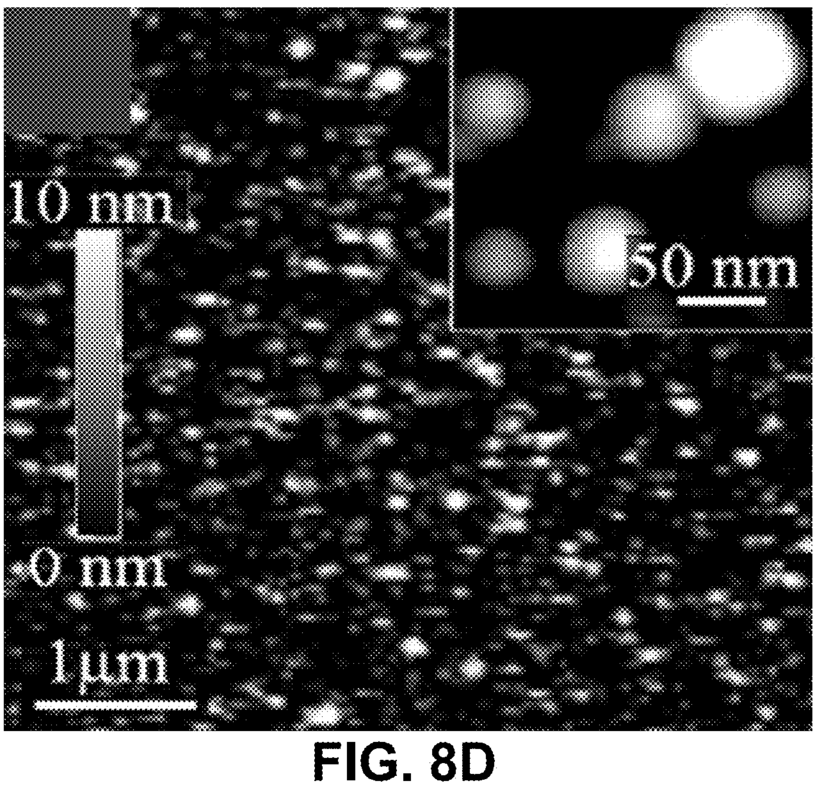
Figure 9A:
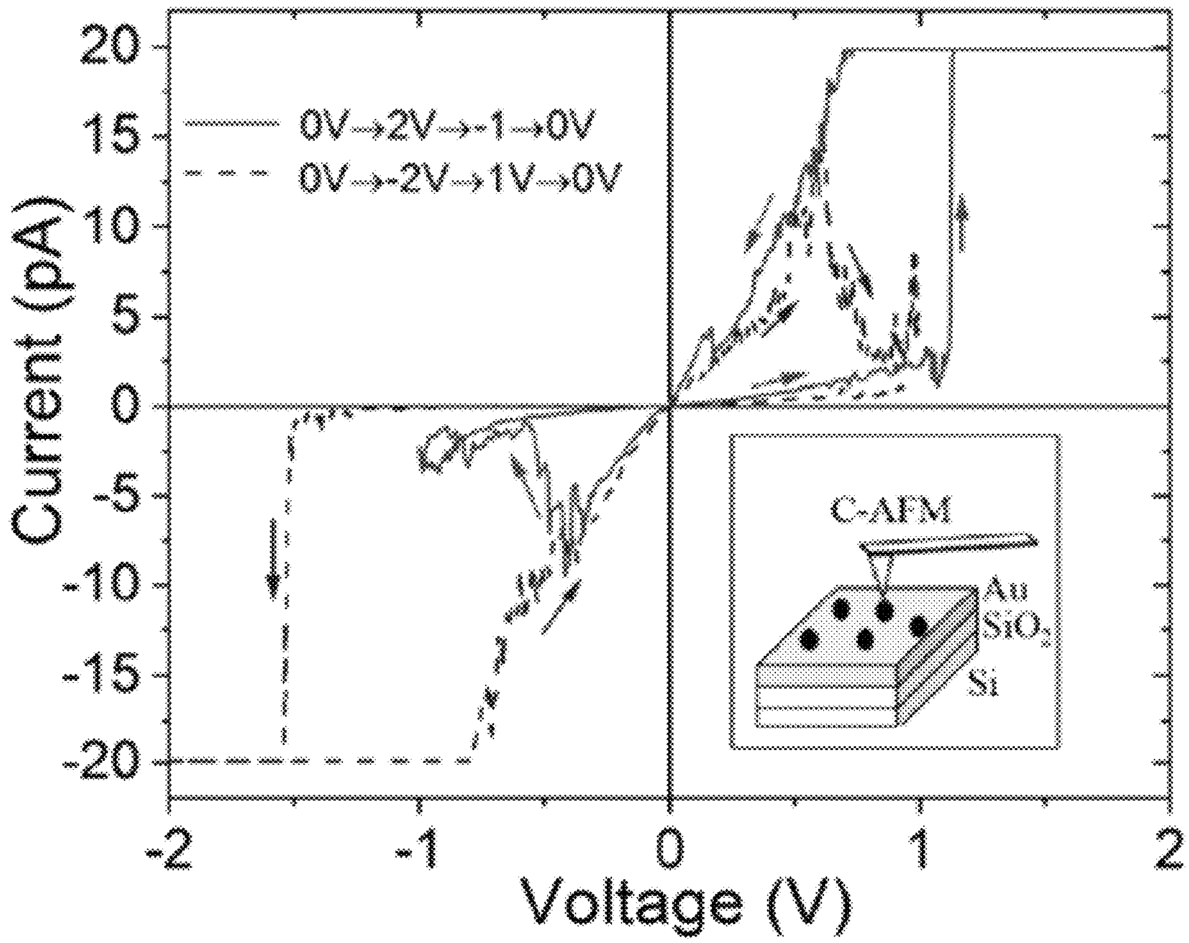
FIGS. 9A-9B: I-V characteristics on a single Co/ZnO nanoparticle formed (FIG. 9A) ex situ with sweep ranges of −2 V to 1 V (from 0 V to −2 V, −2 V to 1 V, and 1 V to 0 V) in dashed blue and 2 V to −1 V (from 0 V to 2 V, 2 V to −1 V, and −1 V to 0 V) in solid red (FIG. 9B) in situ with sweep ranges of −2 V to 1 V (from 0 V to −2 V, −2 V to 1 V, and 1 V to 0 V) in dashed blue and 2 V to −1 V (from 0 V to 2 V, 2 V to −1 V, and −1 V to 0 V) in solid red.
Figure 9B:
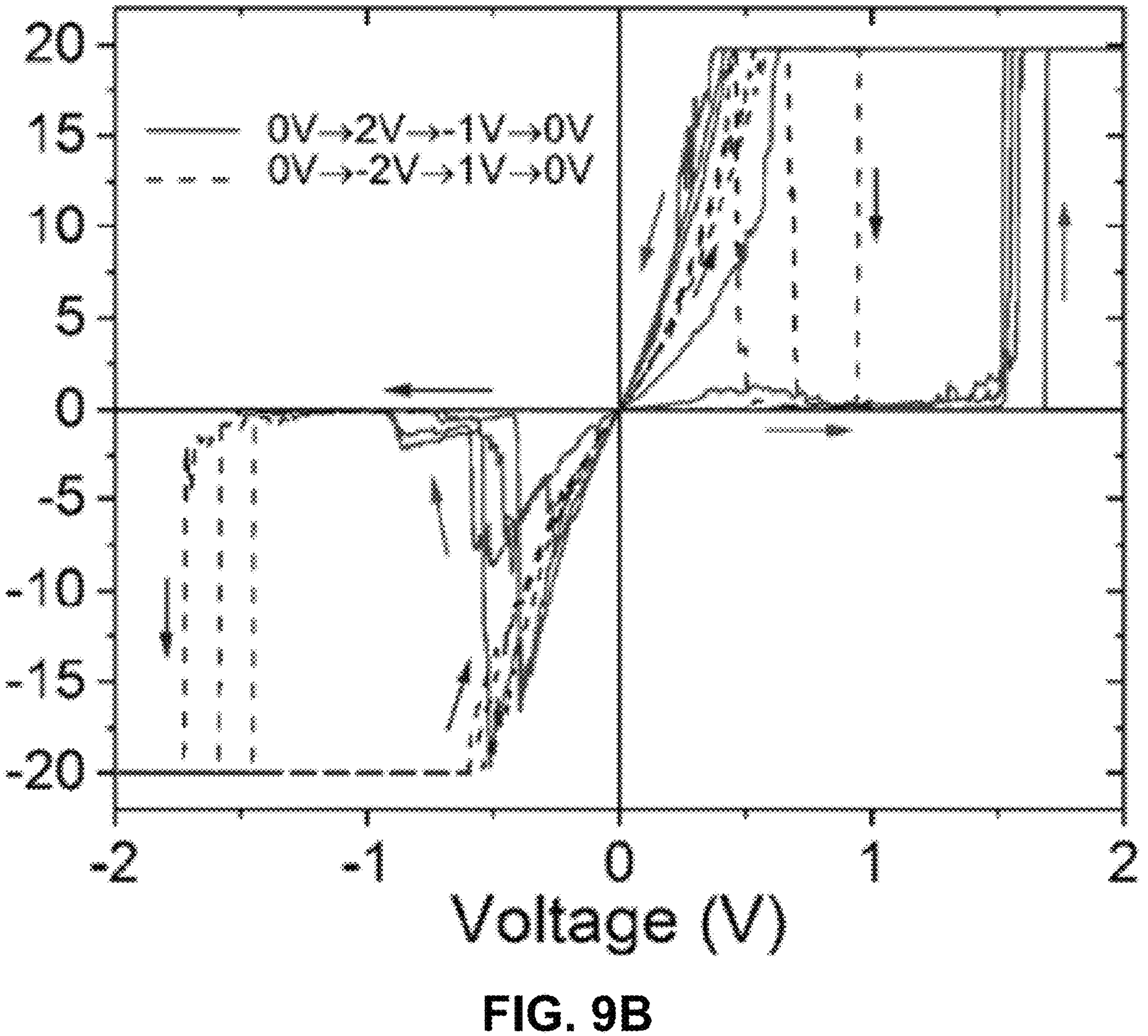

TEM of these larger nanoparticles confirmed that they are core/shell as well (FIGS. 8A and 8B). In this case, the ZnO shell is on the order of 4 nm for ex situ oxide shell formation and 3 nm for in situ oxidation FIGS. 8C and 8D show AFM images of Co/ZnO nanoclusters formed by both ex situ and in situ processes on $Si/SiO_2/Au$ substrate, respectively. FIGS. 9A-9B show the I-V curve of single Co/ZnO nanoparticles formed via ex and in situ oxidation. The I-V curves show characteristic bipolar resistive switching under a current compliance of 20 nA, and it is important to note that no electroforming process was required to activate the resistive switching behavior.

Curves for two separate ex situ-formed individual nanoparticles are shown in FIG. 9A; in one, the voltage was swept from 0 V to 2 V to −1 V to 0 V (solid red line), while for the second the bias was reversed and the voltage sweep was from 0 V to −2 V to 1 V to 0 V (dashed blue line).

For the first nanoparticle, there was a dramatic increase in current at approximately 1.0 V, while for the second (blue dashed line) the breakdown voltage was about −1.5 V. This behavior is characteristic of the resistive switching phenomenon, where the "set" or "ON" occurs when the material switches from a high resistance state (HRS) to a low resistance state (LRS). The I-V curves were hysteretic, with a subsequent change in state from LRS to HRS at about −(+)0.5 V, again which is independent of the original bias. At any given voltage the current in the LRS is higher than in the HRS. It is worthwhile to note that the current in ON and OFF states is very low so that the system requires very low power consumption during operation. The memory window defined as $R_{off}/R_{on}$ ($R_{off}$ and $R_{on}$ are resistances of HRS and LRS, respectively) was about $3\times10^2$ at the read voltage of 0.85 V, enabling the periphery circuit to easily distinguish between the two states (i.e., either a "0" (e.g., HRS) or "1" (e.g., LRS)) and meet the requirement of non-volatile memory devices. The memory window here is about the same as that reported for single core-MgO/shell-cobalt oxide nanowires by Nagashima et al.[60] and larger than a 100 nm-thick ZnO thin film reported by Zhao et al.[61] and 60 nm thick Co:ZnO film by Chen et al.[62] In the nanoparticles formed via ex situ oxidation, it was not possible to sweep the voltage more than one and half cycles due to either drifting of nanoparticles or the instability of nanoclusters due to localized heating from the measurement process. However, I-V measurements on numerous nanoparticles showed consistent resistive switching behavior.

FIG. 9B shows the I-V behavior for a single Co/ZnO nanocluster formed in situ using the same device structure and conductive AFM set up. The voltage was applied from 0 V to 2 V to −1 V and back to 0 V (red solid line) and from 0 V to −2 V to 1 V and back to 0 V (blue dashed line), this time on the same nanoparticle. The bipolar resistive switching behavior with "set" and "reset" processes was also observed for these nanoclusters, as shown in FIG. 9B. This switching behavior was consistent regardless of the initial bias. In this case, the transition from the HRS to the LRS (the "set") occurred at about −(+)1.5 V for all four cycles of voltage sweep.

However, unlike the ex situ-formed nanoparticles, multiple cycles were possible for in situ nanoparticles, showing reproducibility of "set" and "reset" processes.

The "reset" voltages, though, were at about −(+)0.5 V for all four cycles. These nanoclusters were more stable than the core/shell nanoclusters formed via ex situ oxidation. The polarity dependence of switching again seems to be consistent with electrochemical redox as the dominant mechanism.[60] The maximum $R_{off}/R_{on}$ obtained for this system was about $3.6\times10^3$ at a read voltage of 1.4 V, which is much larger than that observed for Co/ZnO formed via ex situ oxidation. Thus, the two states, HRS and LRS, are much more distinguishable for the Co/ZnO structure formed in situ than the Co/ZnO formed via ex situ oxidation.

The resistive switching behavior observed in these Co/ZnO core/shell nanoparticles exhibits the typical bipolar characteristic where the "set" and "reset" processes occur in opposite voltage polarities. That is, writing and erasing of memory cells depends on the polarity of the voltage. For the mechanism of switching in RRAM, the most likely explanation is the formation and rupture of conductive filaments or pathways.[63] Polarity dependence implies that the filamentary rupture caused by Joule heating does not play a dominant role in the "reset" process.[64] In the case of transition metals as the active layer, formation and rupture of the conductive paths is caused by the reduction and oxidation of the transition metal oxide (here, ZnO), and subsequent defect migration to form linkages in the active layer.[2,64,65] While generally the conduction of thin (<3 nm) metal oxide films is via direct tunneling, the I-V behavior here with oxide thin films of similar scale do not show characteristic direct tunneling behavior.[66] The conductivity in initially insulating metal oxide structures is thought to involve the development of a conductive path via electric field-induced reduction of the metal and the subsequent migration of defects (such as oxygen vacancies) to form a conductive filament.[67,61] In this case, the conductive path is made through the ZnO shell. The role of Co in the core is unclear at this point. It may just provide a high-conductivity pathway once the thin ZnO develops a conductive path, essentially serving to minimize the scale of the structure/device (i.e., create a shorter path through which bridging must occur to obtain conduction). However, Santos, et al. sandwiched a thin Fe layer between layers of ZnO in their device and determined that oxidation/reduction of the Fe enhanced the conduction process.[69]

Figure 10:
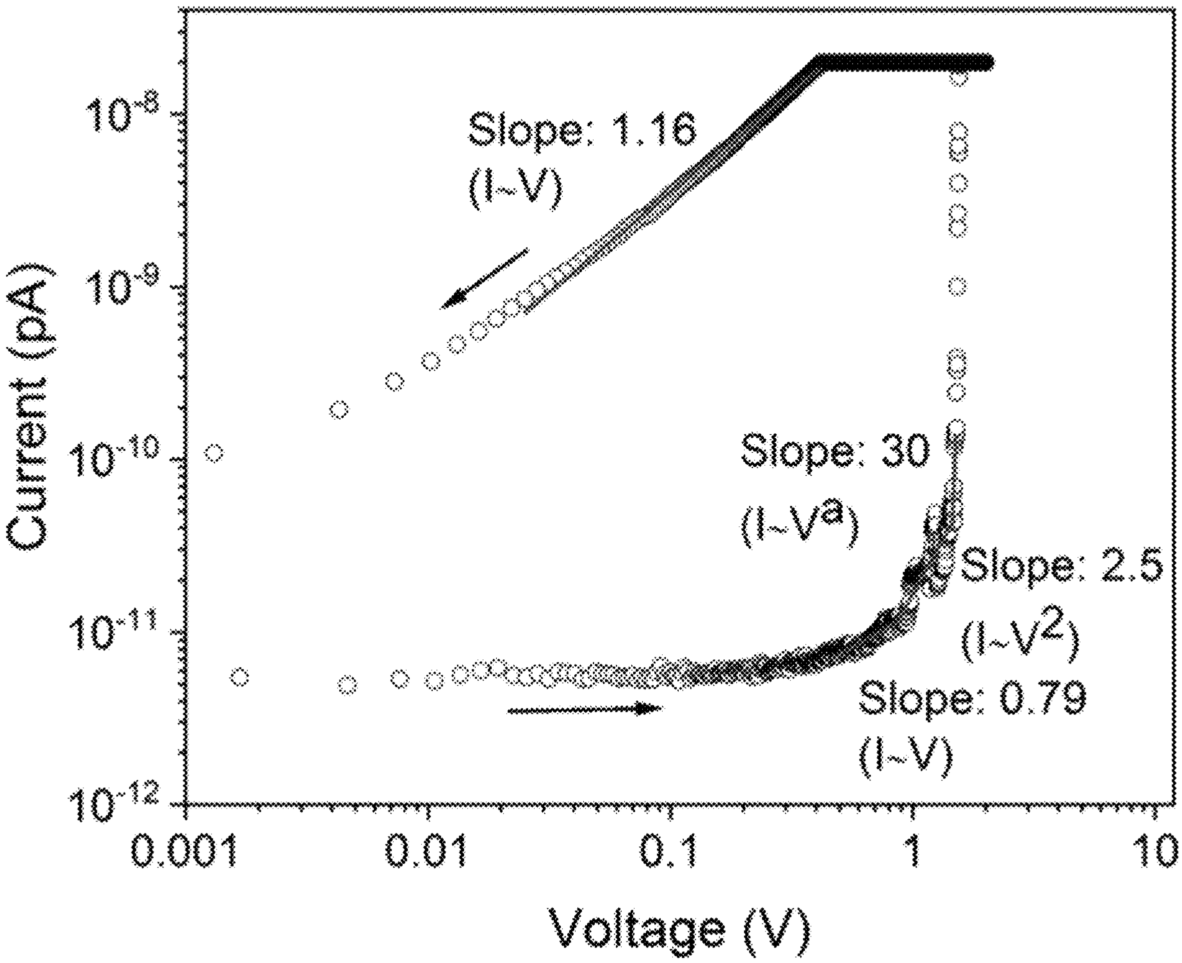
FIG. 10: log I v. log V plot of the LRS and HRS representing conduction mechanisms.

To understand the conduction mechanism in HRS and LRS, the positive sweep region of in situ I-V curve was replotted with a double log scale (FIG. 10). The linear slope of the LRS in the log I v. log V curve is close to 1, which can be explained by using an Ohmic conduction model[62]. However, the conduction mechanism in the HRS is more complicated and the log I v. log V curve in the HRS and "set" process is composed of three parts with different slopes, an Ohmic region with I-V followed by the Child's square-law region with $I\sim V^2$, and a region displaying a steep increase in current with $I\sim V^a$ (a>2, which shows existence of the traps or oxygen vacancies)[70] characteristic of space-charge-limited conduction (SCLC).[71,72] These results are in good agreement with previous studies of ZnO-based devices.[64,73] In the low voltage (>1 V) region the injected carriers are less than intrinsic thermal carriers, thus Ohmic conduction is expected. However, at higher voltages (higher injected carrier density) the injected carriers fill in the traps (oxygen vacancies) in the oxide layer immediately, leading to a high current gain (with the slope of the log I v. log V curve about 30).

Overview of Example 1: In this Example, bipolar resistive switching is found in individual core/shell nanoparticles with sizes on the order of 50 nm. Inert gas condensation was used to make Co/ZnO core/shell nanoparticles. In one case, the core/shell structures resulted from the preferential oxidation of Zn in alloy nanoparticles occurred upon exposure to atmosphere ("ex situ"). In this case, the shell was polycrystalline. Co/ZnO core/shell nanoparticles were also formed by bleeding air into the deposition chamber ("in situ"). In this case, the ZnO shell was single crystalline and semi-epitaxial with the Co core.

Bipolar resistive switching behavior was observed on individual nanoparticles using conductive AFM. A characteristic sharp transition from a high resistance state to a low resistance state, and vice versa, was observed. The transition occurred at a lower voltage for the core/shell nanoparticles formed ex situ, but those nanoparticles did not survive multiple cycles. The core/shell nanoparticles formed in situ survived multiple cycles, with the "set" voltage decreasing with each cycle. The small currents and voltages in both these systems resulted in low power consumption, and both types of nanoparticles showed high resistance ratios $R_{off}/R_{on}$ (300 for ex situ-formed nanoparticles, 3600 for in situ-formed nanoparticles).

References, each of which is incorporated herein by reference in its entirety to the extend not inconsistent herewith, corresponding to Example 1:

[1] Y. Yang, P. Sheridan, W. Lu, *Appl. Phys. Lett.* 2012, 100, 203112.
[2] J. Qi, M. Olmedo, J. Ren, N. Zhan, J. Zhao, J.-G. Zheng, J. Liu, *ACS Nano* 2012, 6, 1051.
[3] C. Yoshida, K. Kinoshita, T. Yamasaki, Y. Sugiyama, *Appl. Phys. Lett.* 2008, 93, 042106.
[4] M.-J. Lee, S. Han, S. H. Jeon, B. H. Park, B. S. Kang, S.-E. Ahn, K. H. Kim, C. B. Lee, C. J. Kim, I.-K. Yoo, *Nano Lett.* 2009, 9, 1476.
[5] S. Seo, M. J. Lee, D. H. Seo, E. J. Jeoung, D.-S. Suh, Y. S. Joung, I. K. Yoo, I. R. Hwang, S. H. Kim, I. S. Byun, *Appl. Phys. Lett.* 2004, 85, 5655.

[6] M. J. Rozenberg, M. J. Sanchez, R. Weht, C. Acha, F. Gomez-Marlasca, P. Levy, *Phys. Rev. B* 2010, 81, 115101.

[7] S.-E. Ahn, M.-J. Lee, Y. Park, B. S. Kang, C. B. Lee, K. H. Kim, S. Seo, D.-S. Suh, D.-C. Kim, J. Hur, *Adv. Mater.* 2008, 20, 924.

[8] J. S. Choi, J.-S. Kim, I. R. Hwang, S. H. Hong, S. H. Jeon, S.-O. Kang, B. H. Park, D. C. Kim, M. J. Lee, S. Seo, *Appl. Phys. Lett.* 2009, 95, 022109.

[9] S. H. Chang, J. S. Lee, S. C. Chae, S. B. Lee, C. Liu, B. Kahng, D.-W. Kim, T. W. Noh, *Phys. Rev. Lett.* 2009, 102, 026801.

[10] K. M. Kim, C. S. Hwang, *Appl. Phys. Lett.* 2009, 94, 122109.

[11] C. Rohde, B. J. Choi, D. S. Jeong, S. Choi, J.-S. Zhao, C. S. Hwang, *Appl. Phys. Lett.* 2005, 86, 262907.

[12] J. J. Yang, M. D. Pickett, X. Li, D. A. Ohlberg, D. R. Stewart, R. S. Williams, *Nat. Nanotechnol.* 2008, 3, 429.

[13] K. Fujiwara, T. Nemoto, M. J. Rozenberg, Y. Nakamura, H. Takagi, *Jpn. J. Appl. Phys.* 2008, 47, 6266.

[14] H. Shima, F. Takano, H. Muramatsu, H. Akinaga, Y. Tamai, I. H. Inque, H. Takagi, *Appl. Phys. Lett.* 2008, 93, 113504.

[15] H. Shima, F. Takano, Y. Tamai, H. Akinaga, I. H. Inoue, *Jpn. J. Appl. Phys.* 2007, 46, L57.

[16] D. O. Schmidt, S. Hoffmann-Eifert, H. Zhang, C. La Torre, A. Besmehn, M. Noyong, R. Waser, U. Simon, *Small* 2015, 11, 6444.

[17] J. B. Mallinson, S. Shirai, S. K. Acharya, S. K. Bose, E. Galli, S. A. Brown, Sci. Adv. 2019, 5, eaaw8438.

[18] J. M. Cruz-Albrecht, T. Derosier, N. Srinivasa, *Nanotechnology* 2013, 24, 384011.

[19] S. K. Bose, S. Shirai, J. B. Mallinson, S. A. Brown, *Faraday Discuss.* 2019, 213, 471.

[20] A. S. Sokolov, Y.-R. Jeon, S. Kim, B. Ku, C. Choi, *NPG Asia Mater.* 2019, 11, 1.

[21] A. M. El-Toni, M. A. Habila, J. P. Labis, Z. A. ALOthman, M. Alhoshan, A. A. Elzatahry, F. Zhang, *Nanoscale* 2016, 8, 2510.

[22] S. Wei, Q. Wang, J. Zhu, L. Sun, H. Lin, Z. Guo, *Nanoscale* 2011, 3, 4474.

[23] R. Ghosh Chaudhuri, S. Paria, *Chem. Rev.* 2012, 112, 2373.

[24] A. V. Nomoev, S. P. Bardakhanov, M. Schreiber, D. G. Bazarova, N. A. Romanov, B. B. Baldanov, B. R. Radnaev, V. V. Syzrantsev, *Beilstein J. Nanotechnol.* 2015, 6, 874.

[25] J.-G. Oh, H. Kim, Curr. *Appl. Phys.* 2013, 13, 130.

[26] V. V. Srdić, B. Mojid, M. Nikolid, S. Ognjanović, *Process. Appl. Ceram.* 2013, 7, 45.

[27] I. W. Guo, I. C. Pekcevik, M. C. Wang, B. K. Pilapil, B. D. Gates, *Chem. Commun.* 2014, 50, 8157.

[28] K. Han, Z. Zhao, Z. Xiang, C. Wang, J. Zhang, B. Yang, *Mater. Lett.* 2007, 61, 363.

[29] S. Bukka, Y. Umehara, K. Higashimine, R. Badam, R. Vedarajan, N. Matsumi, *Mater. Res. Express* 2018, 5, 115016.

[30] S. Kaviani, M. Mohammadi Ghaleni, E. Tavakoli, S. Nejati, *ACS Appl. Polym. Mater.* 2019, 1, 552.

[31] P. Mukherjee, B. Balamurugan, J. E. Shield, D. J. Sellmyer, *RSC Adv.* 2016, 6, 92765.

[32] G. P. Zograf, D. A. Zuev, V. A. Milichko, I. S. Mukhin, M. A. Baranov, E. V. Ubyivovk, S. V. Makarov, P. A. Belov, In *Journal of Physics: Conference Series*; IOP Publishing, 2016; Vol. 741, p. 012119.

[33] J. Fang, L. Schlag, S.-C. Park, T. Stauden, J. Pezoldt, P. Schaaf, H. O. Jacobs, *Adv. Mater.* 2016, 28, 1770.

[34] M. R. Sanaee, E. Bertran, *J. Nanomater.* 2015, 2015.

[35] L. Lin, Q. Wang, *Plasma Chem. Plasma Process.* 2015, 35, 925.

[36] A. Kumar, P. A. Lin, A. Xue, B. Hao, Y. K. Yap, R. M. Sankaran, *Nat. Commun.* 2013, 4, 2618.

[37] W. Bouwen, P. Thoen, F. Vanhoutte, S. Bouckaert, F. Despa, H. Weidele, R. E. Silverans, P. Lievens, *Rev. Sci. Instrum.* 2000, 71, 54.

[38] M. A. Duncan, *Rev. Sci. Instrum.* 2012, 83, 041101.

[39] K. Sattler, J. Mühlbach, E. Recknagel, *Phys. Rev. Lett.* 1980, 45, 821.

[40] Y. Chen, G. C. Egan, J. Wan, S. Zhu, R. J. Jacob, W. Zhou, J. Dai, Y. Wang, V. A. Danner, Y. Yao, *Nat. Commun.* 2016, 7, 1.

[41] L. Martínez, M. Díaz, E. Roman, M. Ruano, D. Llamosa P, Y. Huttel, *Langmuir* 2012, 28, 11241.

[42] O. Kylián, A. Shelemin, P. Solař, P. Pleskunov, D. Nikitin, A. Kuzminova, R. Štefaníková, P. Kúš, M. Cieslar, J. Hanuš, *Materials* 2019, 12, 2366.

[43] D. Llamosa, M. Ruano, L. Martinez, A. Mayoral, E. Roman, M. García-Hernández, Y. Huttel, *Nanoscale* 2014, 6, 13483.

[44] A. Mayoral, D. Llamosa, Y. Huttel, *Chem. Commun.* 2015, 51, 8442.

[45] M. Benelmekki, M. Bohra, J.-H. Kim, R. E. Diaz, J. Vernieres, P. Grammatikopoulos, M. Sowwan, *Nanoscale* 2014, 6, 3532.

[46] M. Benelmekki, J. Vernieres, J.-H. Kim, R.-E. Diaz, P. Grammatikopoulos, M. Sowwan, *Mater. Chem. Phys.* 2015, 151, 275.

[47] J. Vernieres, S. Steinhauer, J. Zhao, P. Grammatikopoulos, R. Ferrando, K. Nordlund, F. Djurabekova, M. Sowwan, *Adv. Sci.* 2019, 6, 1900447.

[48] J.-G. Mattei, P. Grammatikopoulos, J. Zhao, V. Singh, J. Vernieres, S. Steinhauer, A. Porkovich, E. Danielson, K. Nordlund, F. Djurabekova, *Chem. Mater.* 2019, 31, 2151.

[49] M. A. Koten, P. Mukherjee, J. E. Shield, *Part. Part. Syst. Charact.* 2015, 32, 848.

[50] P. Mukherjee, L. Zhou, M. J. Kramer, J. E. Shield, *Appl. Phys. Lett.* 2013, 102, 243103.

[51] P. A. N. Feng, C. Chao, Z. Wang, Y. Yang, Y. Jing, Z. Fei, *Prog. Nat. Sci. Mater. Int.* 2010, 20, 1.

[52] Y. C. Yang, F. Pan, F. Zeng, M. Liu, *J. Appl. Phys.* 2009, 106, 123705.

[53] H. Haberland, M. Karrais, M. Mall, Y. Thurner, *J. Vac. Sci. Technol. Vac. Surf. Films* 1992, 10, 3266.

[54] L. Vitos, A. V. Ruban, H. L. Skriver, J. Kollar, *Surf. Sci.* 1998, 411, 186.

[55] P. Franke, D. Neuschitz, S. G. T. Europe (SGTE, In *Binary Systems. Part 5: Binary Systems Supplement* 1; Springer; pp. 1-4.

[56] F. Golkar, M. J. Kramer, Y. Zhang, R. Skomski, D. J. Sellmyer, J. E. Shield, *J. Nanoparticle Res.* 2013, 15, 1638.

[57] P. Mukherjee, X. Jiang, Y. Q. Wu, M. J. Kramer, J. E. Shield, *J. Phys. Chem. C* 2013, 117, 24071.

[58] D. A. Porter, K. E. Easterling, *Phase transformations in metals and alloys* (*revised reprint*); CRC press, 2009.

[59] Y.-M. Kim, J.-M. Jeong, J.-G. Kim, Y.-J. Kim, *J. Korean Phys. Soc.* 2006, 48, 250.

[60] K. Nagashima, T. Yanagida, K. Oka, M. Taniguchi, T. Kawai, J.-S. Kim, B. H. Park, *Nano Lett.* 2010, 10, 1359.

[61] J. Zhao, F. Liu, J. Sun, H. Huang, Z. Hu, X. Zhang, *Chin. Opt. Lett.* 2012, 10, 013102.

[62] G. Chen, C. Song, C. Chen, S. Gao, F. Zeng, F. Pan, *Adv. Mater.* 2012, 24, 3515.

[63] Y. Fujisaki, *Jpn. J. Appl. Phys.* 2010, 49, 100001.

[64] Y. C. Yang, F. Pan, Q. Liu, M. Liu, F. Zeng, *Nano Lett.* 2009, 9, 1636.
[65] Y. Lai, W. Qiu, Z. Zeng, S. Cheng, J. Yu, Q. Zheng, *Nanomaterials* 2016, 6, 16.
[66] E. J. Patiño, N. G. Kelkar, *Appl. Phys. Lett.* 2015, 107, 253502.
[67] X. Li, J. Jia, Y. Li, Y. Bai, J. Li, Y. Shi, L. Wang, X. Xu, *Sci. Rep.* 2016, 6, 1.
[68] C. Li, B. Gao, Y. Yao, X. Guan, X. Shen, Y. Wang, P. Huang, L. Liu, X. Liu, J. Li, *Adv. Mater.* 2017, 29, 1602976.
[69] Y. P. Santos, E. Valença, R. Machado, M. A. Macêdo, *Mater. Sci. Semicond. Process.* 2018, 86, 43.
[70] Z. Çaldiran, M. Şinoforoğlu, Ö. Metin, Ş. Aydoğan, K. Meral, *J. Alloys Compd.* 2015, 631, 261.
[71] K. M. Kim, B. J. Choi, Y. C. Shin, S. Choi, C. S. Hwang, *Appl. Phys. Lett.* 2007, 91, 012907.
[72] Q. Liu, W. Guan, S. Long, R. Jia, M. Liu, J. Chen, *Appl. Phys. Lett.* 2008, 92, 012117.
[73] Y. Han, K. Cho, S. Kim, *Microelectron. Eng.* 2011, 88, 2608.

Example 2: Additional Embodiments

Embodiment 1: A core/shell nanoparticle comprising: a metallic core; a shell formed of a metal oxide and surrounding the metallic core; wherein the nanoparticle is characterized by bipolar resistive switching in response to an applied voltage or current.

Embodiment 2: The core/shell nanoparticle of embodiment 1, wherein the core comprises Co or is consisting essentially of Co.

Embodiment 3. The core/shell nanoparticle of embodiment 1 or 2, wherein the shell comprises ZnO or is consisting essentially of ZnO.

Embodiment 4. The core/shell nanoparticle of any one of the preceding embodiments, wherein the metal oxide is a dielectric material.

Embodiment 5. The core/shell nanoparticle of any one of the preceding embodiments, wherein the shell is characterized by electroforming-free bipolar resistive switching in response to the applied voltage or current.

Embodiment 6. The core/shell nanoparticle of any one of the preceding embodiments, wherein the shell is a single crystal.

Embodiment 7. The core/shell nanoparticle of any one of the preceding embodiments, wherein an interface between the core and the shell is at least partially epitaxial.

Embodiment 8. The core/shell nanoparticle of any one of the preceding embodiments, wherein an interface between the core and the shell is characterized by dislocations every 5 Å or more in the core, a magnitude of a Burgers vector of dislocations of less than or equal to 3 Å, and/or a lattice mismatch less than or equal to 60%.

Embodiment 9. The core/shell nanoparticle of any one of the preceding embodiments, wherein an interface between the core and the shell is characterized by dislocations every 4 to 6 Å in the core, a magnitude of a Burgers vector of dislocations selected from the range of 2 Å to 3 Å, and/or a lattice mismatch selected from the range of 40% to 60%.

Embodiment 10. The core/shell nanoparticle of any one of the preceding embodiments having a diameter selected from the range of 3 nm to 100 nm.

Embodiment 11. The core/shell nanoparticle of any one of the preceding embodiments, wherein the core has a face centered cubic or a hexagonal closed packed crystal structure.

Embodiment 12. The core/shell nanoparticle of any one of the preceding embodiments, wherein the shell has a hexagonal closed packed crystal structure.

Embodiment 13. The core/shell nanoparticle of any one of the preceding embodiments, wherein the nanoparticle's bipolar resistive switching is characterized by a memory window of 300 or greater; wherein the memory window corresponds to a ratio of a resistance at a high resistance state (HRS) at a given voltage to a resistance at a 10 low resistance state (LRS) at the given voltage.

Embodiment 14. The core/shell nanoparticle of any one of the preceding embodiments, wherein the nanoparticle's bipolar resistive switching is characterized by a memory window of 3000 or greater.

Embodiment 15. A device comprising: a positive electrode; a negative electrode; a nanoparticle network in electronic communication with the positive electrode and the negative electrode; wherein the nanoparticle network comprises: a plurality of core/shell nanoparticles, each nanoparticle being the nanoparticle according any one of the preceding embodiments; wherein the negative and positive electrodes are in electronic communication with each other via the nanoparticle network; wherein the device is characterized by bipolar resistive switching in response to an applied voltage or current.

Embodiment 16. The device of embodiment 15 being characterized by electroforming-free bipolar resistive switching in response to the applied voltage or current.

Embodiment 17. The device of embodiment 15 or 16, wherein the nanoparticle network comprises two or more unique current-conduction pathways between the positive electrode and the negative electrode.

Embodiment 18. The device of any one of embodiments 15-17, wherein a first portion of the nanoparticle network is in physical contact with the positive electrode and a second portion of the nanoparticle network is in physical contact with the negative electrode.

Embodiment 19. The device of any one of embodiments 15-18, wherein current conduction in the nanoparticle network is characterized by Ohmic conduction, Child's square law conduction, and/or space-charge-limited conduction.

Embodiment 20. The device of any one of embodiments 15-19, wherein the plurality of core/shell nanoparticles have a ratio of standard deviation of size to average size of 0.4 or less.

Embodiment 21. The device of any one of embodiments 15-20, wherein the plurality of core/shell nanoparticles have an average size selected from the range of 3 nm to 100 nm.

Embodiment 22. The device of any one of embodiments 15-21 being a resistive switching device, an artificial synapse, a non-transitory computer-readable media, a sensor, or a combination of these.

Embodiment 23. A non-transitory computer-readable media comprising the device according to any one of embodiments 15-22.

Embodiment 24. An artificial neural network comprising the device according to any one of embodiments 15-22.

Embodiment 25. A method of using the device according to any one of embodiments 15-22, the method comprising steps of: applying a voltage or current between the negative electrode and the positive electrode; and detecting a resistance between the negative electrode and the positive electrode.

Embodiment 26. A method for making the core/shell nanoparticle according to any one of embodiments 1-14, the method comprising steps of: forming nanoclusters dispersed in a gas; wherein each nanocluster comprises a first material and a second material; depositing the nanoclusters on a substrate; and oxidizing the second material of each nanocluster, thereby forming the nanoparticle, wherein the core comprises the first material and the shell comprises the second material.

Embodiment 27. The method of embodiment 26, wherein the forming step comprises sputtering the nanoclusters of a target comprising the first material and the second material.

Embodiment 28. The method of embodiment 26 or 27, wherein the gas is an inert gas.

Embodiment 29. The method of any one of embodiments 26-28, wherein the oxidizing step is performed only after the depositing step is complete.

Embodiment 30. The method of any one of embodiments 26-29, wherein (i) the oxidizing step is performed during the forming step or (ii) the oxidizing step is performed during the forming step and after the depositing step.

Embodiment 31. The method of any one of embodiments 26-30, wherein the first material is Co and the second material is Zn and/or ZnO.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

As used herein and in the appended claims, the singular forms “a”, “an”, and “the” include plural reference unless the context clearly dictates otherwise. Thus, for example, reference to “a cell” includes a plurality of such cells and equivalents thereof known to those skilled in the art. As well, the terms “a” (or “an”), “one or more” and “at least one” can be used interchangeably herein. It is also to be noted that the terms “comprising”, “including”, and “having” can be used interchangeably. The expression “of any of claims XX-YY” (wherein XX and YY refer to claim numbers) is intended to provide a multiple dependent claim in the alternative form, and in some embodiments is interchangeable with the expression “as in any one of claims XX-YY.”

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Certain molecules disclosed herein may contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every composition, particle, material, device, reagent, system, structure, geometry, feature, or combination thereof described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant’s invention, including compounds for which an enabling disclosure is provided in the references cited herein, are not intended to be included in the composition of matter claims herein.

As used herein, “comprising” is synonymous with “including,” “containing,” or “characterized by,” and is inclusive or open-ended and does not exclude additional, unrecited elements or method steps. As used herein, “consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

In general, the terms and phrases used herein have their art-recognized meaning, which can be found by reference to standard texts, journal references and contexts known to those skilled in the art.

We claim:

1. A core/shell nanoparticle comprising:
a metallic core; and
a shell formed of a metal oxide and surrounding the metallic core, wherein the shell is a single crystal;
wherein the core/shell nanoparticle is characterized by bipolar resistive switching in response to an applied voltage or current.

2. The core/shell nanoparticle of claim 1, wherein the metallic core comprises Co metal.

3. The core/shell nanoparticle of claim 2, wherein the shell comprises ZnO.

4. The core/shell nanoparticle of claim 1, wherein the metal oxide is a dielectric material.

5. The core/shell nanoparticle of claim 1, wherein the shell is characterized by electroforming-free bipolar resistive switching in response to the applied voltage or current.

6. A core/shell nanoparticle comprising:
a metallic core; and
a shell formed of a metal oxide and surrounding the metallic core,
wherein an interface between the metallic core and the shell is at least partially epitaxial, and wherein the core/shell nanoparticle is characterized by bipolar resistive switching in response to an applied voltage or current.

7. The core/shell nanoparticle of claim 1, wherein an interface between the metallic core and the shell is characterized by dislocations every 5 Å or more in the core, a magnitude of a Burgers vector of dislocations of less than or equal to 3 Å, and/or a lattice mismatch less than or equal to 60%.

8. The core/shell nanoparticle of claim 1, wherein an interface between the metallic core and the shell is characterized by dislocations every 4 to 6 Å in the core, a magnitude of a Burgers vector of dislocations selected from the range of 2 Å to 3 Å, and/or a lattice mismatch selected from the range of 40% to 60%.

9. The core/shell nanoparticle of claim 1 having a diameter selected from the range of 3 nm to 100 nm.

10. The core/shell nanoparticle of claim 1, wherein the metallic core has a face centered cubic or a hexagonal closed packed crystal structure.

11. The core/shell nanoparticle of claim 1, wherein the bipolar resistive switching is characterized by a memory window of 300 or greater; wherein the memory window corresponds to a ratio of a resistance at a high resistance state (HRS) at a given voltage to a resistance at a low resistance state (LRS) at the given voltage.

12. The core/shell nanoparticle of claim 1, wherein the bipolar resistive switching is characterized by a memory window of 3000 or greater.

13. A device comprising:
a positive electrode;
a negative electrode;
a nanoparticle network in electronic communication with the positive electrode and the negative electrode; wherein the nanoparticle network comprises:
a plurality of core/shell nanoparticles, each core/shell nanoparticle comprising:
a metallic core; and
a shell formed of a metal oxide and surrounding the metallic core, wherein the shell is a single crystal;
wherein the core/shell nanoparticles are characterized by bipolar resistive switching in response to an applied voltage or current;
wherein the negative and positive electrodes are in electronic communication with each other via the nanoparticle network; and
wherein the device is characterized by bipolar resistive switching in response to the applied voltage or current.

14. The device of claim 13 being characterized by electroforming-free bipolar resistive switching in response to the applied voltage or current.

15. The device of claim 13, wherein the nanoparticle network comprises two or more unique current-conduction pathways between the positive electrode and the negative electrode.

16. The device of any one of claim 13, wherein a first portion of the nanoparticle network is in physical contact with the positive electrode and a second portion of the nanoparticle network is in physical contact with the negative electrode; and wherein current conduction in the nanoparticle network is characterized by Ohmic conduction, Child's square law conduction, and/or space-charge-limited conduction.

17. The device of claim 13, wherein the plurality of core/shell nanoparticles have a ratio of standard deviation of size to average size of 0.4 or less.

18. The device of claim 13, wherein the plurality of core/shell nanoparticles have an average size selected from the range of 3 nm to 100 nm.

19. The device of claim 13 being a resistive switching device, an artificial synapse, a non-transitory computer-readable media, a sensor, an artificial neural network, or a combination of these.

20. A method of using a device, the method comprising steps of:

applying a voltage or current between a negative electrode and a positive electrode; and detecting a resistance between the negative electrode and the positive electrode;

wherein the device comprises:

the positive electrode;

the negative electrode;

a nanoparticle network in electronic communication with the positive electrode and the negative electrode; wherein the nanoparticle network comprises:

a plurality of core/shell nanoparticles, each core/shell nanoparticle comprising:

a metallic core; and a shell formed of a metal oxide and surrounding the metallic core, wherein the shell is a single crystal;

wherein the core/shell nanoparticles are characterized by bipolar resistive switching in response to an applied voltage or current;

wherein the negative and positive electrodes are in electronic communication with each other via the nanoparticle network; and wherein the device is characterized by bipolar resistive switching in response to the applied voltage or current.

21. A method for making a core/shell nanoparticle, the method comprising steps of:

forming nanoclusters dispersed in a gas; wherein each nanocluster comprises a first material and a second material;

depositing the nanoclusters on a substrate; and oxidizing the second material of each nanocluster, thereby forming the core/shell nanoparticle;

wherein the core/shell nanoparticle comprises:

a metallic core; and a shell formed of a metal oxide and surrounding the metallic core;

wherein the core/shell nanoparticle is characterized by bipolar resistive switching in response to an applied voltage or current; and wherein the metallic core comprises the first material and the shell comprises the second material.

* * * * *